(12) United States Patent
Daubenspeck et al.

(10) Patent No.: US 8,084,858 B2
(45) Date of Patent: Dec. 27, 2011

(54) METAL WIRING STRUCTURES FOR UNIFORM CURRENT DENSITY IN C4 BALLS

(75) Inventors: Timothy H. Daubenspeck, Colchester, VT (US); Wolfgang Sauter, Richmond, VT (US); Timothy D. Sullivan, Underhill, VT (US); Steven L. Wright, Cortlandt Manor, NY (US); Edmund Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 12/424,001

(22) Filed: Apr. 15, 2009

(65) Prior Publication Data

US 2010/0263913 A1    Oct. 21, 2010

(51) Int. Cl.
*H01L 23/48* (2006.01)
*H01L 23/52* (2006.01)
*H01L 29/40* (2006.01)

(52) U.S. Cl. .................. 257/734; 257/758; 257/774

(58) Field of Classification Search .......... 257/734, 257/758, 774
See application file for complete search history.

(56) References Cited

U.S. PATENT DOCUMENTS

| | | | |
|---|---|---|---|
| 6,577,017 B1 * | 6/2003 | Wong | 257/786 |
| 6,960,828 B2 | 11/2005 | Nair et al. | |
| 7,033,923 B2 | 4/2006 | Seshan | |
| 7,034,402 B1 | 4/2006 | Seshan | |
| 7,115,985 B2 * | 10/2006 | Antol et al. | 257/700 |
| 7,253,528 B2 | 8/2007 | Dauksher et al. | |
| 7,297,631 B2 | 11/2007 | Nair et al. | |
| 7,312,530 B2 * | 12/2007 | Hashimoto et al. | 257/758 |
| 2003/0218259 A1 * | 11/2003 | Chesire et al. | 257/786 |
| 2009/0212439 A1 * | 8/2009 | Farooq et al. | 257/773 |

OTHER PUBLICATIONS

U.S. Appl. No. 11/872,870, entitled "Microelectronic Device Connection Structure" filed Oct. 16, 2007, First Named Inventor: Timothy H. Daubenspeck.
U.S. Appl. No. 11/461,148, entitled "Microelectronic Device Connection Structure" filed Jul. 31, 2006, First Named Inventor: Steven L. Wright et al.

* cited by examiner

*Primary Examiner* — Thien F Tran
(74) *Attorney, Agent, or Firm* — Scully, Scott, Murphy & Presser, P.C.; Richard M. Kotulak, Esq.

(57) ABSTRACT

In one embodiment, a sub-pad assembly of metal structures is located directly underneath a metal pad. The sub-pad assembly includes an upper level metal line structure abutting the metal pad, a lower level metal line structure located underneath the upper level metal line structure, and a set of metal vias that provide electrical connection between the lower level metal line structure located underneath the upper level metal line structure. In another embodiment, the reliability of a C4 ball is enhanced by employing a metal pad structure having a set of integrated metal vias that are segmented and distributed to facilitate uniform current density distribution within the C4 ball. The areal density of the cross-sectional area in the plurality of metal vias is higher at the center portion of the metal pad than at the peripheral portion of the planar portion of the metal pad.

10 Claims, 32 Drawing Sheets

METAL WIRING STRUCTURES FOR UNIFORM CURRENT DENSITY IN C4 BALLS

FIELD OF THE INVENTION

The present invention relates to semiconductor structures, and particularly, to metal wiring structures for bonding pads and methods of manufacturing the same.

BACKGROUND OF THE INVENTION

Once formation of semiconductor devices and interconnects on a semiconductor wafer (substrate) is completed, the semiconductor wafer is diced into semiconductor chips, or "dies." Functional semiconductor chips are then packaged to facilitate mounting on a circuit board. A package is a supporting element for the semiconductor chip that provides mechanical protection and electrical connection to an upper level assembly system such as the circuit board. One typical packaging technology is Controlled Collapse Chip Connection (C4) packaging, which employs C4 balls each of which contacts a C4 pad on the semiconductor chip and another C4 pad on a packaging substrate. The packaging substrate may then be assembled on the circuit board.

Each C4 pad is a contiguous metal pad typically formed out of the last metal layer of a metal interconnect structures during a semiconductor manufacturing sequence. Each C4 pad is large enough to accommodate the bottom portion of a C4 ball. A bond pad structure refers to a structure containing such a C4 pad and attached structures underneath.

A metal structure such as a C4 ball comprises a lattice of metal ions and non-localized free electrons. When electrical current flows through a C4 ball, the metal ions are subjected to an electrostatic force due to the charge of the metal ion and the electric field to which the metal ion is exposed to. Further, as electrons scatter off the lattice during conduction of electrical current, the electrons transfer momentum to the metal ions in the lattice of the conductor material. The direction of the electrostatic force is in the direction of the electric field, i.e., in the direction of the current, and the direction of the force due to the momentum transfer of the electrons is in the direction of the flow of the electrons, i.e., in the opposite direction of the current. However, the force due to the momentum transfer of the electrons is generally greater than the electrostatic force. Thus, metal ions are subjected to a net force in the opposite direction of the current, or in the direction of the flow of the electrons. The mass transport caused by the electrical current, or the movement of the conductive material due to electrical current, is termed electromigration in the art.

Once a void is formed by electromigration in a C4 ball, the current density at a critical conduction path, or the "hot spot," increases because the void reduces the area of the conductive path. The higher current density thus accelerates the electromigration process, thereby making the void grow. The vicious cycle of the mutually reinforcing increase in the size of the void and the current density eventually leads to an effective disconnect in the electrical path, causing an electromigration failure. The electromigration failure is a major reliability concern for the C4 balls.

Therefore, there exists a need to reduce the electromigration failure of C4 balls to enhance the reliability of C4 connections.

SUMMARY OF THE INVENTION

The present invention enhances reliability of a C4 ball by providing a metal wiring structure that facilitates uniform current density distribution within the C4 ball.

In the present invention, a sub-pad assembly of metal structures are provided, which is located directly underneath a metal pad. The sub-pad assembly includes an upper level metal line structure abutting the metal pad, a lower level metal line structure located underneath the upper level metal line structure, and a set of metal vias that provide electrical connection between the lower level metal line structure located underneath the upper level metal line structure. The set of metal vias are distributed to provide a higher current density at the center portion of the metal pad than at the peripheral portion of the metal pad that contacts a C4 ball. After a C4 ball is bonded to the metal pad, the geometry of the sub-pad assembly causes more current through the center of the metal pad so that the current density in the C4 ball becomes uniform, thereby reducing electromigration therein.

According to an aspect of the present invention, a structure is provided, which includes: a metal pad disposed over a metal interconnect structure; an upper level metal line structure abutting the metal pad; a lower level metal line structure located underneath the upper level metal line structure; and a set of metal vias, wherein the set of metal vias has a higher areal density of horizontal cross-sectional area underneath a center region of the metal pad than underneath peripheral regions of the metal pad.

The set of metal vias has a non-uniform spacing between neighboring metal vias at least along one horizontal direction. The horizontal direction may be the same for a set of one-dimensional arrays within the set of metal vias. Alternately, the horizontal direction may be a radial direction from a center point, and the set of one-dimensional arrays may be oriented in many different directions. Further, the set of metal vias may have a non-uniform spacing between neighboring metal vias in two different directions in a horizontal plane, in which spacing between neighboring metal vias are modulated in both directions. The non-uniform spacing among neighboring metal vias in the set of metal vias is distributed such that the overall density of cross-sectional area in a center region of the contact area between the metal pad and the C4 ball is greater than the overall density of cross-sectional area in peripheral regions of the contact area.

According to another aspect of the present invention, a method of forming a structure is provided, which includes: forming a metal interconnect structure including a lower level metal line structure on a substrate; forming a set of metal vias directly on the lower level metal line structure; forming an upper level metal line structure directly on the set of metal vias; and forming a metal pad on the upper level metal line, wherein the set of metal vias is formed in an arrangement that have a higher areal density of conductive horizontal cross-sectional area underneath a center region of the metal pad than underneath peripheral regions of the metal pad.

Further, the present invention enhances reliability of a C4 ball by providing a metal pad structure having a set of integrated metal vias that are segmented and distributed to facilitate uniform current density distribution within the C4 ball. The areal density of the cross-sectional area in the plurality of metal vias is higher at the center portion of the metal pad than at the peripheral portion of the planar portion of the metal pad than at a peripheral region of the planar portion of the metal pad. After a C4 ball is bonded to the metal pad, the distribution of the variation in the areal density of the cross-sectional area causes more current through the center of the metal pad so that the current density in a C4 ball thereupon becomes uniform, thereby reducing electromigration within the C4 ball.

According to an aspect of the present invention, a structure is provided, which includes: a metal pad of integral construction and disposed over a metal interconnect structure and including an upper planar portion and a plurality of metal vias extending downward; and a metal line structure abutting bottom surfaces of the plurality of metal vias, wherein the plurality of metal vias has a higher areal density of horizontal cross-sectional area underneath a center region of the metal pad than underneath peripheral regions of the metal pad.

The plurality of metal vias has a non-uniform spacing between neighboring metal vias at least along one horizontal direction. The horizontal direction may be the same for a plurality of one-dimensional arrays within the plurality of metal vias. Alternately, the horizontal direction may be a radial direction from a center point, and the plurality of one-dimensional arrays may be oriented in many different directions. Further, the plurality of metal vias may have a non-uniform spacing between neighboring metal vias in two different directions in a horizontal plane, in which spacing between neighboring metal vias are modulated in both directions. The non-uniform spacing among neighboring metal vias in the plurality of metal vias is distributed such that the overall density of cross-sectional area in a center region of the contact area between the metal pad and the C4 ball is greater than the overall density of cross-sectional area in peripheral regions of the contact area.

According to another aspect of the present invention, a method of forming a structure is provided, which includes: forming a metal interconnect structure including a metal line structure on a substrate; forming a passivation dielectric layer on the metal line structure; forming a metal pad of integral construction over the metal interconnect structure and including an upper planar portion and a plurality of metal vias extending downward and contacting the metal line structure, wherein the plurality of metal vias has a higher areal density of horizontal cross-sectional area underneath a center region of the metal pad than underneath peripheral regions of the metal pad, and wherein the upper planar portion is formed over a top surface of the passivation dielectric layer and the plurality of metal vias is laterally surrounded by the passivation dielectric layer.

BRIEF DESCRIPTION OF THE DRAWINGS

FIG. 1A is a vertical cross-sectional view, and FIGS. 1B-1E are horizontal cross-sectional views.

FIG. 15A is a vertical cross-sectional view, and FIGS. 15B-15D are horizontal cross-sectional views.

FIG. 16A is a vertical cross-sectional view, and FIGS. 16B and 16C are horizontal cross-sectional views.

DETAILED DESCRIPTION OF THE INVENTION

Figure 1A:
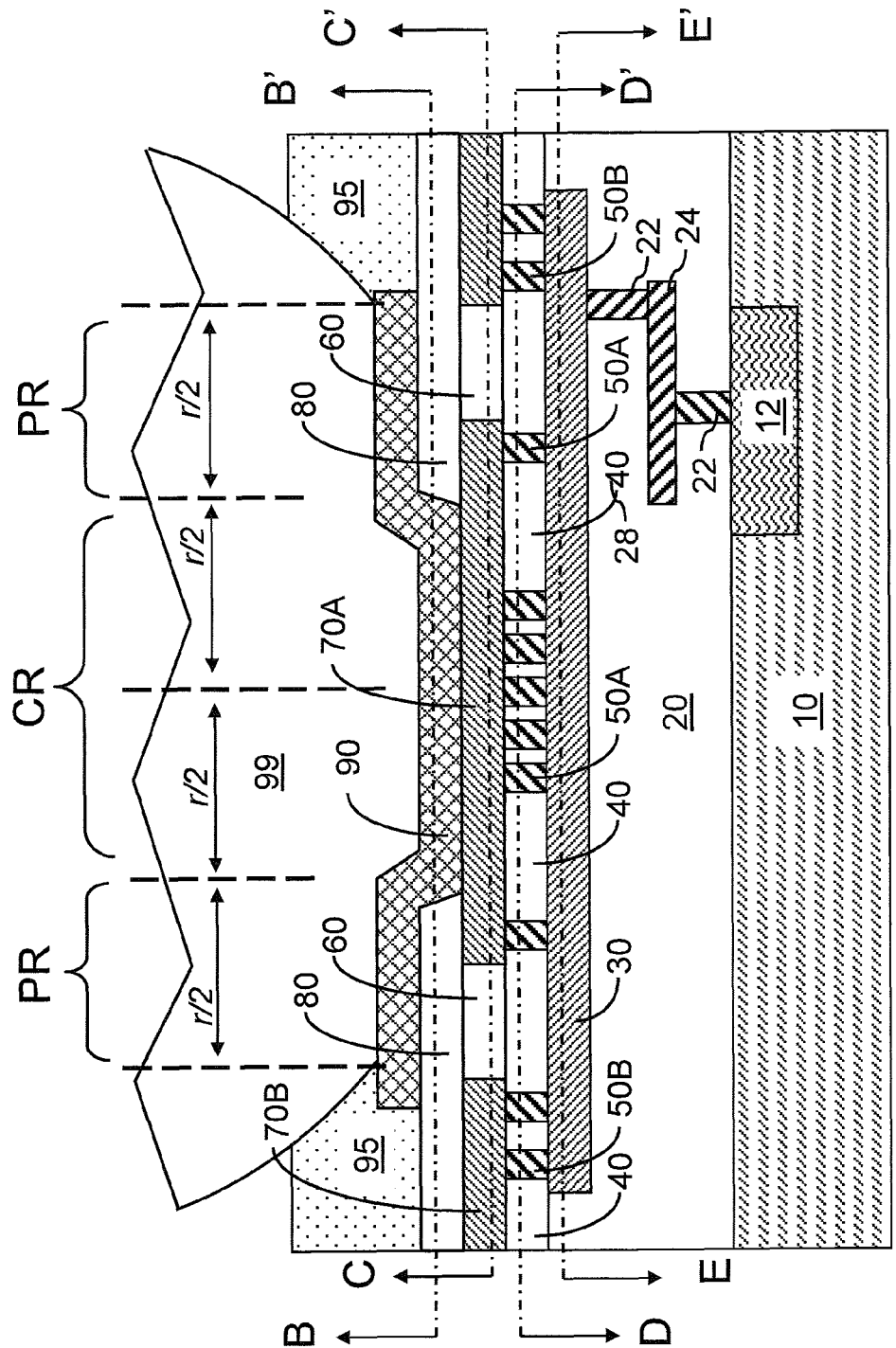
FIGS. 1A, 1B, 1C, 1D, and 1E are cross-sectional views along the planes A-A', B-B', C-C', D-D', and E-E', respectively, of a first exemplary structure that employs a first set of metal vias and a first lower level metal line structure according to the present invention.
Figure 1B:
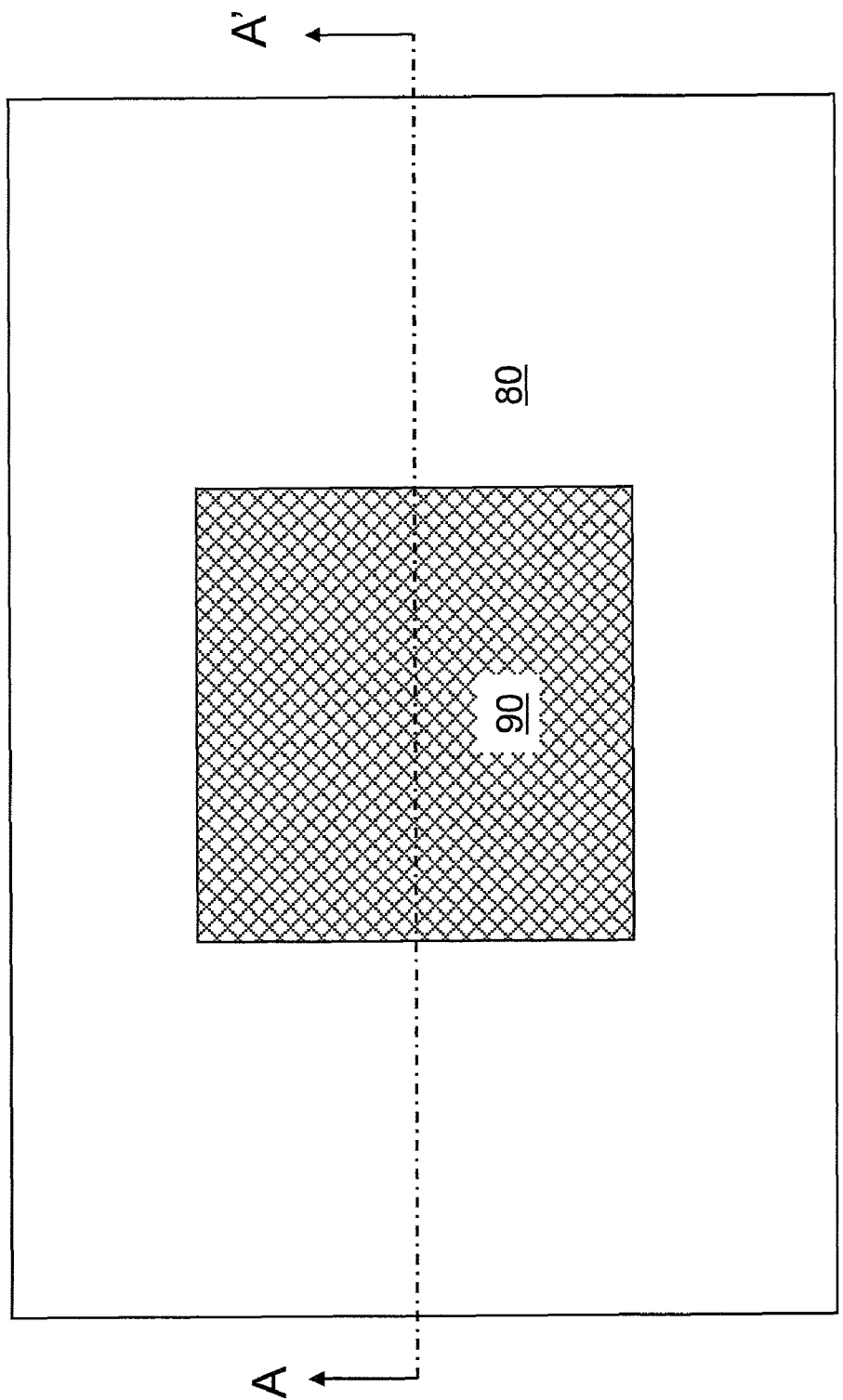
Figure 1C:
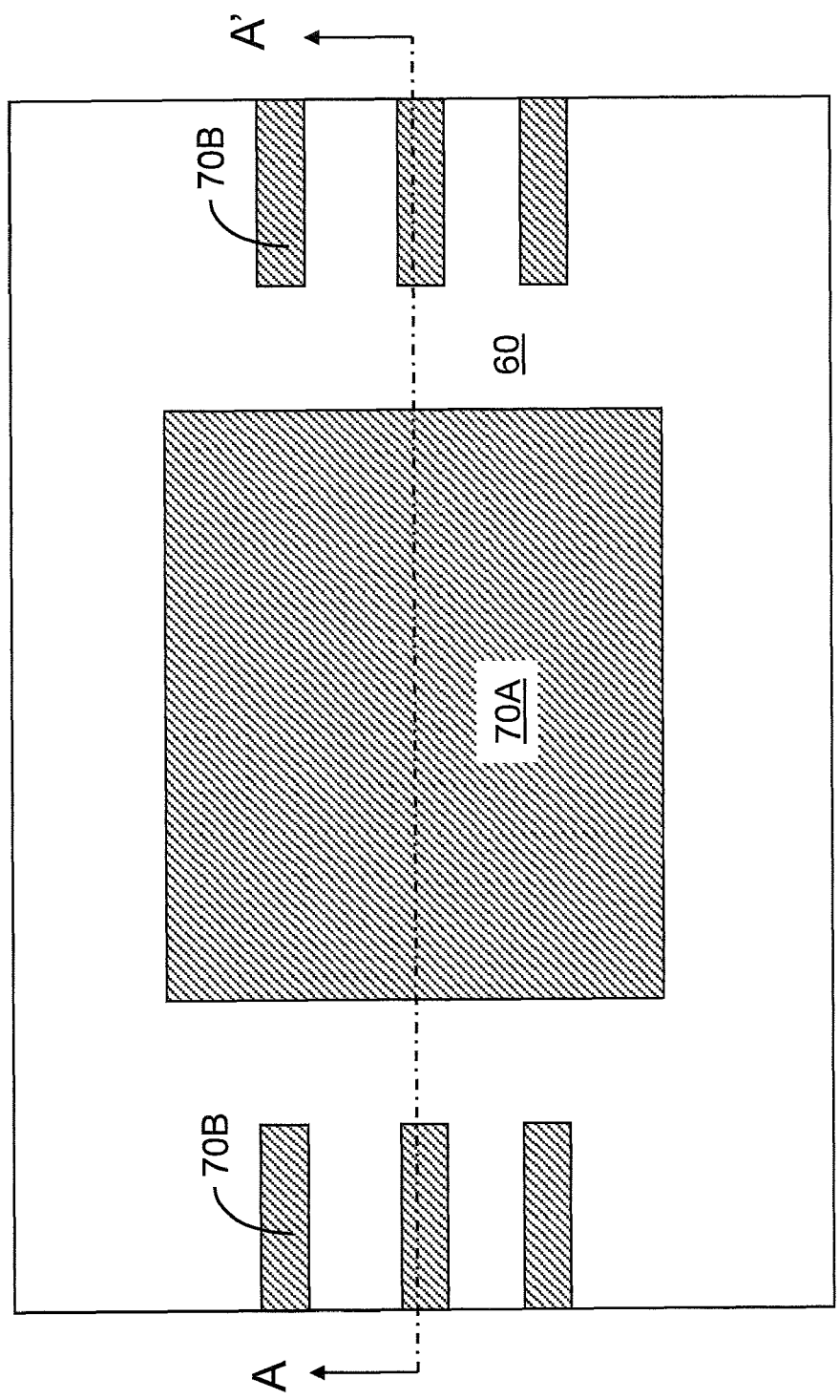
Figure 1D:
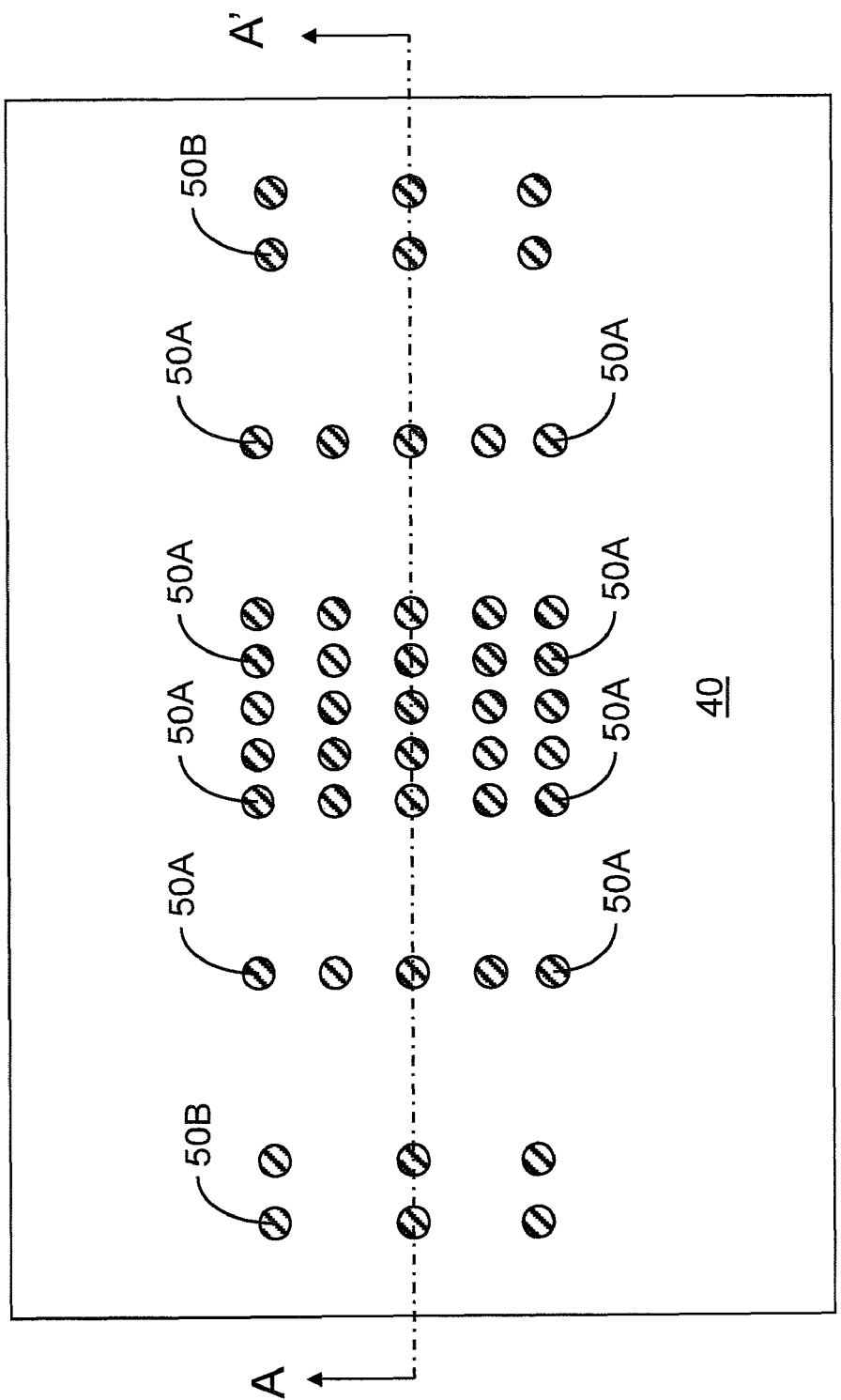
Figure 1E:
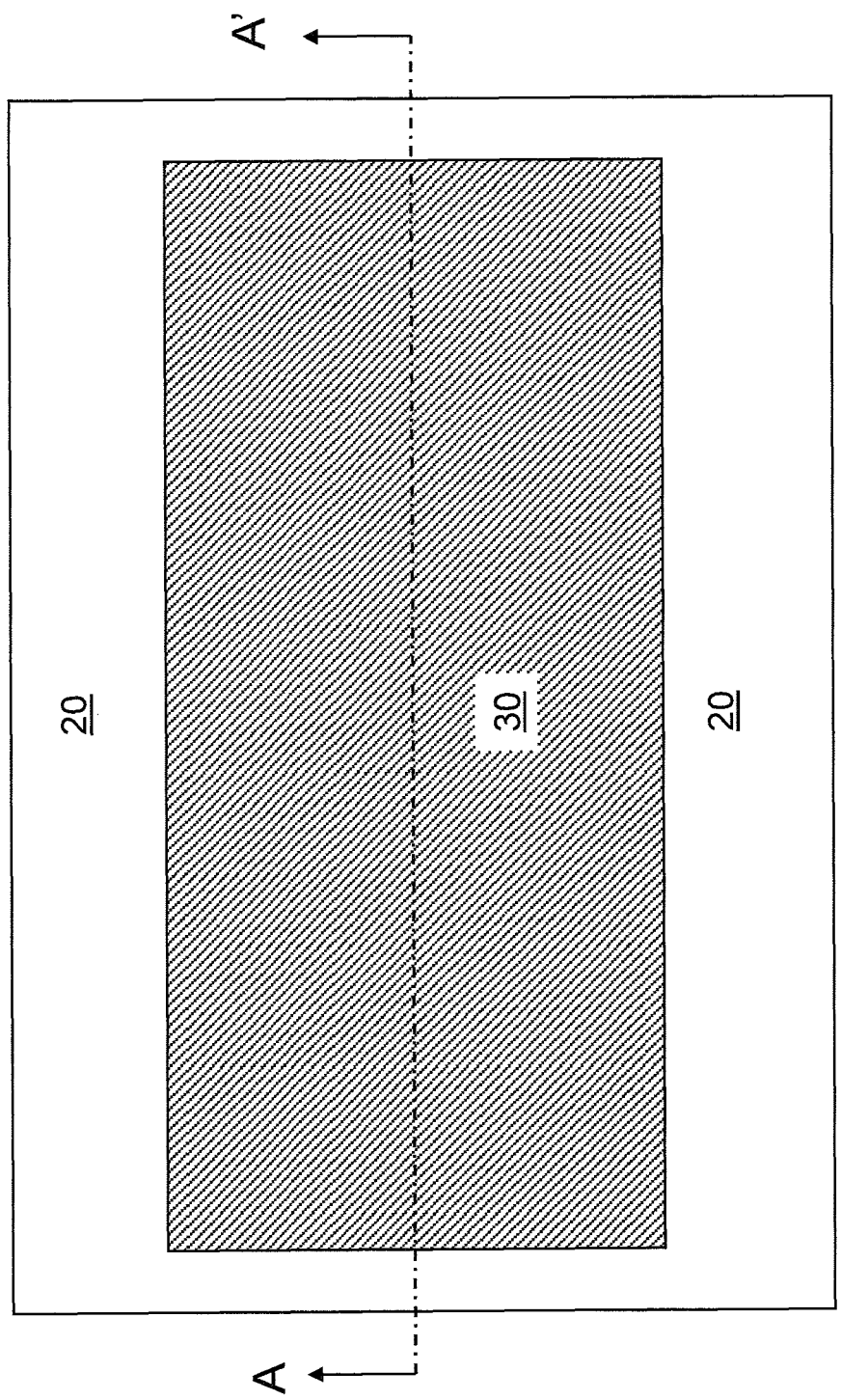

As stated above, the present invention relates to metal wiring structures for bonding pads and methods of manufacturing the same, which are now described in detail with accompanying figures. It is noted that like and corresponding elements are referred to by like reference numerals. The drawings are not in scale.

Referring to FIGS. 1A-1E, a first exemplary structure according to a first embodiment of the present invention is shown. The first exemplary structure includes a substrate 10 and at least one semiconductor device 12 formed therein. The substrate 10 may be a semiconductor substrate comprising a semiconductor material such as silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. The substrate may be a single crystalline semiconductor substrate.

The at least one semiconductor device 12 may include at least one of a field effect transistor, a bipolar transistor, a diode, a resistor, a capacitor, and an inductor. At least one dielectric layer 20 is located on the at least one semiconductor device 12. The at least one dielectric layer 20 may comprise a dielectric oxide such as silicon oxide, a dielectric nitride such as silicon nitride, a low dielectric constant (low-k) chemical vapor deposition (CVD) dielectric material, or a spin-on low-k dielectric material. A metal interconnect structure is embedded in the at least one dielectric layer 20. The metal interconnect structure may include interconnect level metal vias 22 and interconnect level metal lines 24.

A first lower level metal line structure 30 is embedded in the topmost layer of the at least one dielectric layer 20. The first lower level metal line structure 30 may, or may not, include holes, which are typically called "cheesing holes." The metal interconnect structure provides an electrical conduction path between the at least one semiconductor device 12 and the first lower level metal line structure 30. The first lower level metal line structure 30 includes a conductive metal. The first lower level metal line structure 30 may have lateral dimensions from 20 microns to 200 microns, although lesser and greater dimensions are also contemplated herein. In case the lower metal line structure 30 has a rectangular shape, the width and length of the lower metal line structure 30 may be from 20 microns to 200 microns, respectively. The thickness of the first lower level metal line structure 30 is typically from 150 nm to 1,500 nm, although lesser and greater thicknesses are also contemplated herein. The first lower level metal line structure 30 includes at least one metal. The first lower level metal line structure 30 may consist essentially of copper or aluminum. Preferably, the first lower level metal line structure 30 may consist essentially of copper.

A via level dielectric layer 40 is located over the first lower level metal line structure 30. The via level dielectric layer 40 may comprise a dielectric oxide, a dielectric nitride, a low-k CVD dielectric material, a low-k spin-on dielectric material, or a combination thereof. Preferably, the via level dielectric layer 40 includes a dielectric oxide, a dielectric nitride, or a combination thereof to reduce ingress of oxygen or moisture to the at least one dielectric layer 20 located below. A first set of metal vias 50A and interconnect vias 50B are embedded in the via level dielectric layer 40. The thickness of the first set of metal vias 50A and the interconnect vias 50B is typically from 150 nm to 1,500 nm, although lesser and greater thicknesses are also contemplated herein. The first set of metal vias 50A and the interconnect vias 50B include at least one metal. The first set of metal vias 50A and the interconnect vias 50B may consist essentially of copper or aluminum. Preferably, the first set of metal vias 50A and the interconnect vias 50B may consist essentially of copper.

A line level dielectric layer 60 is located over the via level dielectric layer 40. The line level dielectric layer 60 may comprise a dielectric oxide, a dielectric nitride, a low-k CVD dielectric material, a low-k spin-on dielectric material, or a combination thereof. Preferably, the line level dielectric layer 60 includes a dielectric oxide, a dielectric nitride, or a combination thereof to reduce ingress of oxygen or moisture to the at least one dielectric layer 20 located below.

An upper level metal line structure 70A and upper level metal wiring lines 70B are embedded in the line level dielectric layer 60. The upper level metal line structure 70A may have lateral dimensions from 20 microns to 200 microns, although lesser and greater dimensions are also contemplated herein. In case the upper level metal line structure 70A has a rectangular shape, the width and length of the upper level metal line structure 70A may be from 20 microns to 200 microns, respectively. The thickness of the upper level metal line structure 70A is typically from 150 nm to 1,500 nm, although lesser and greater thicknesses are also contemplated herein. The upper level metal line structure 70A and the upper level metal wiring lines 70B include at least one metal. The upper level metal line structure 70A and the upper level metal wiring lines 70B may consist essentially of copper or aluminum. Preferably, the upper level metal line structure 70A and the upper level metal wiring lines 70B consist essentially of copper.

A passivation dielectric layer 80 and a metal pad 90 are located over the line level dielectric layer 60, the upper level metal line structure 70A, and the upper level metal wiring lines 70B. The passivation dielectric layer 80 includes a dielectric oxide, a dielectric nitride, or a combination thereof. Preferably, the passivation dielectric layer 80 includes a stack of a dielectric oxide and a dielectric nitride. Typically, the passivation dielectric layer 80 has a thickness from 300 nm to 3,000 nm, although lesser and greater thicknesses are also contemplated herein.

The metal pad 90 includes at least one via portion and an upper planar portion. The at least one via portion is laterally surrounded by the passivation dielectric layer 80 and abuts the upper level metal line structure 70A. The upper planar portion is located on and above the passivation dielectric layer 80 and on the periphery of the lower via portion. The metal pad 90 contains at least one metal. In one case, the metal pad 90 may consist essentially of aluminum, and each of the upper level metal line structure 70A, the first set of metal vias 50A, and the first lower level metal line structure 30 may consist essentially of copper. The thickness of the metal pad 90 may be from 1.0 micron to 5.0 microns, although lesser and greater thicknesses are also contemplated herein.

A dielectric masking layer 95 with an opening is located over the metal pad 90 and the top surface of the passivation dielectric layer 80. The boundary of the opening is located within the area of the metal pad 90. The dielectric masking layer 95 includes a dielectric material such as polyimide. In some cases, the polyimide may be photosensitive to enable lithographic printing without employing additional photosensitive materials. A C4 ball 99 is located within the opening in the dielectric masking layer 95 and contacts the metal pad 90. The diameter of the C4 ball may be from 30 microns to 200 microns, although lesser and greater diameters are also contemplated herein.

Each metal via in the first set of metal vias 50A vertically abuts the upper level metal line structure 70A and the first lower level metal line structure 30. The metal pad 50A is resistively coupled to the at least one semiconductor device 12 through the upper level metal line structure 70A, the first set of metal vias 50A, and the first lower level metal line structure 30.

The first set of metal vias 50A includes metal vias of substantially the same size. The first set of metal vias 50A has a higher areal density of horizontal cross-sectional area underneath a center region CR of the metal pad 90 than underneath peripheral regions PR of the metal pad. The center region CR includes a center point of the contact area between the metal pad 90 and the C4 ball 99. In the present invention, the center region CR is defined as the subset of the area of the upper level metal line structure 70A that are closer to the center point of the contact area between the metal pad 90 and the C4 ball 99 than the closed boundary of the contact area. In case the contact area is a circle, the radius of the center region CR is one half of the radius r of the contact area. In case the upper level metal line structure 70A has a convex polygonal shape or a convex curvilinear shape, the area of the center region CR may be one fourth of the area of the contact area between the metal pad 60 and the C4 ball 99. The peripheral regions PR are the complement of the center region CR within the contact area. The peripheral regions PR are areas within the closed boundary of the contact area and outside the center region CR.

At least some of metal vias in the first set of metal vias 50A, which have substantially the same size, are arranged in a one-dimensional array in which spacing between neighboring metal vias is less underneath the center region CR than underneath the peripheral regions PR. The first set of metal vias 50A may be arranged in a single one-dimensional array or a plurality of one-dimensional arrays. In case the first set of metal vias 50A are arranged in a plurality of one-dimensional arrays having a same orientation, the spacing between neighboring metal vias is less in a middle portion than in end portions in each of the plurality of one-dimensional arrays. The direction of each one-dimensional array is herein referred to as a first direction, and the direction separating the one-dimensional arrays is herein referred to as a second direction. The spacing in the direction of each one-dimensional array is herein referred to as a first spacing, which is a spacing along the first direction, and the spacing between adjacent one-dimensional array is herein referred to as a second spacing, which is a spacing along the second direction. The first spacing between neighboring metal vias is less under the center region CR than under the peripheral regions PR along the first direction. The second spacing between neighboring metal vias is substantially the same among the first set of metal vias 50A along the second direction, which is different from the first direction.

Each metal via in the first set of metal vias 50A may have a cross-sectional area of a circle or a rectangle. In general, each via in the first set of metal vias 50A may have any polygonal or curvilinear closed shape.

Figure 2:
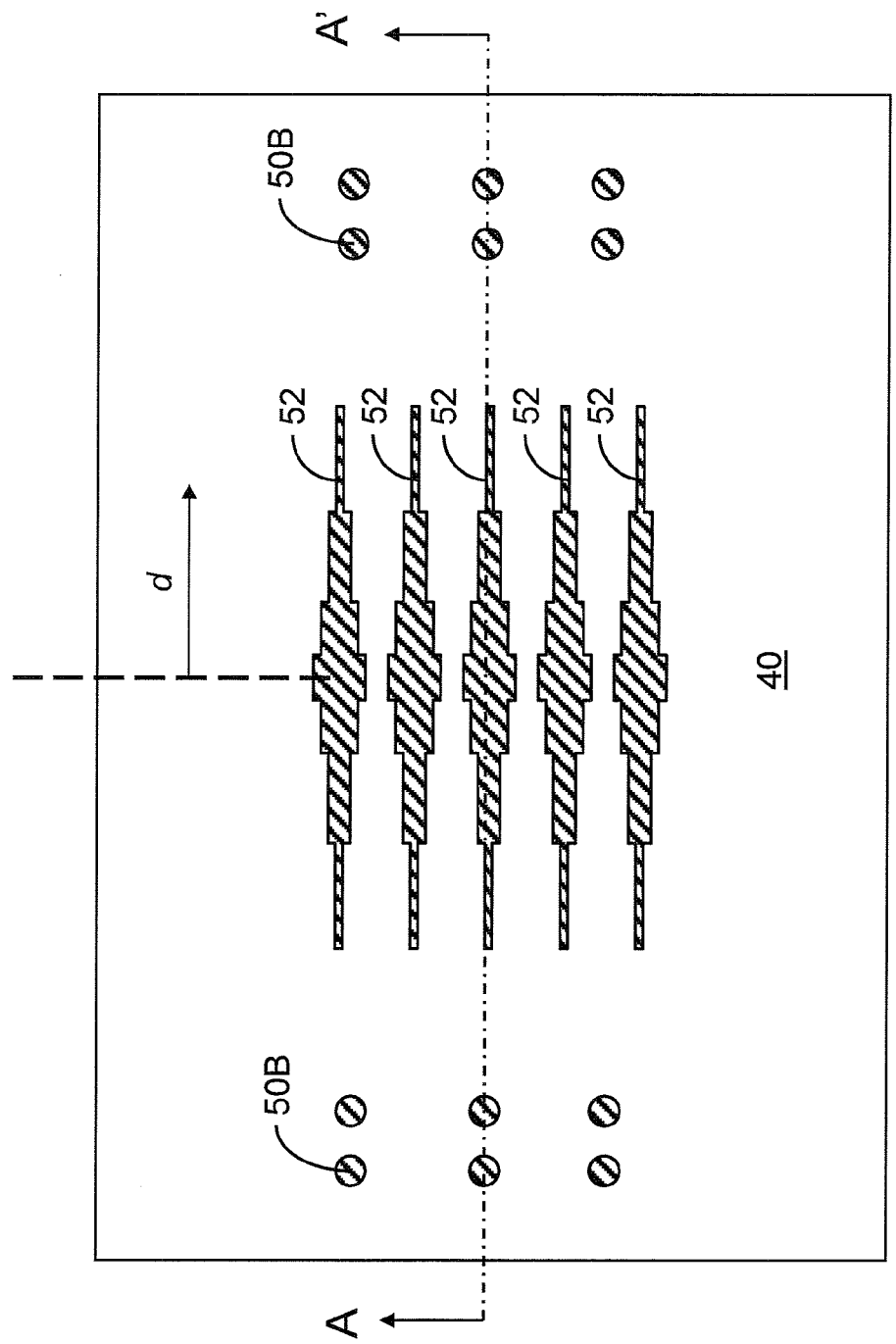
FIG. 2 is a horizontal cross-sectional view of a second exemplary structure that employs a second set of metal vias in a plane corresponding to FIG. 1D according to the present invention.

Different type of metal vias may be employed instead of the type of metal vias in the first set of metal vias in alternative embodiments. Referring to FIG. 2, a second exemplary structure according to a second embodiment of the present invention is shown. The second exemplary structure is derived from the first exemplary structure by substituting a second set of metal vias 52 for the first set of metal vias 50A of the first embodiment. FIG. 2 is a horizontal cross-sectional view of the second exemplary structure in a plane corresponding to FIG. 1D of the first exemplary structure.

Each metal via in the second set of metal vias 52 has an elongated horizontal cross-sectional area. The horizontal width, which is the lateral dimension of a metal via in the direction perpendicular to the elongated direction, monotonically decreases with distance d from a center point in each of the second set of metal vias 52. The center point may be the geometric center of the shape of the horizontal area of a metal via in each of the second set of metal vias 52.

The horizontal width may decreases in steps with distance d from the center point along an elongated direction of each metal via in the second set of metal vias 52. The second set of metal vias 52 may be arranged in a one-dimensional array along the direction of the horizontal width, i.e., along the direction perpendicular to the lengthwise direction of metal vias in the second set of metal vias 52.

Figure 3:
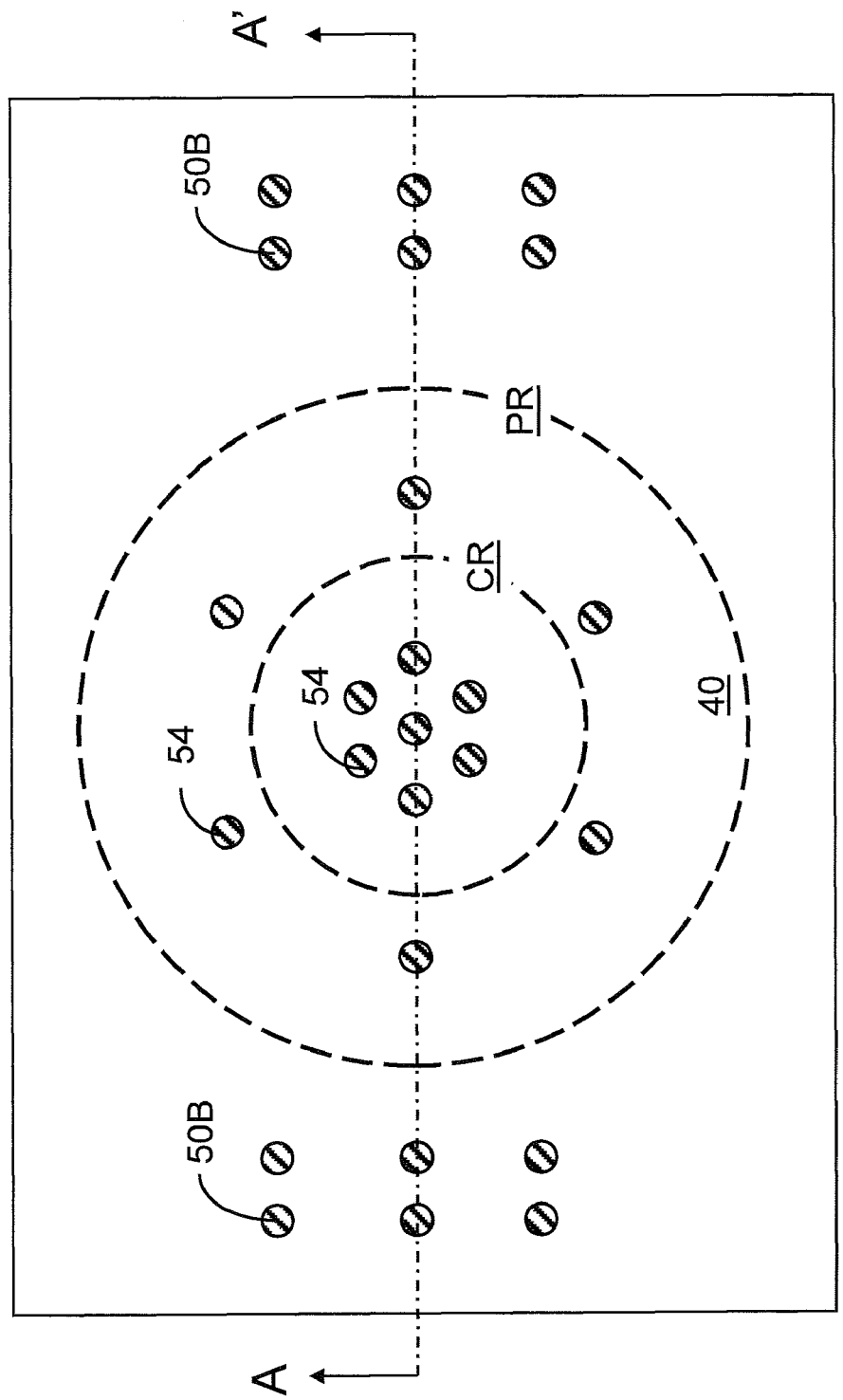
FIG. 3 is a horizontal cross-sectional view of a third exemplary structure that employs a third set of metal vias in a plane corresponding to FIG. 1D according to the present invention.

Referring to FIG. 3, a third exemplary structure according to a third embodiment of the present invention is shown. The third exemplary structure is derived from the first exemplary structure by substituting a third set of metal vias 54 for the first set of metal vias 50A of the first embodiment. FIG. 3 is a horizontal cross-sectional view of the third exemplary structure in a plane corresponding to FIG. 1D of the first exemplary structure.

The third set of metal vias 54 is arranged in a two-dimensional array including a plurality of one-dimensional arrays in radial directions that intersect one another at a center point underneath the center region CR. The spacing between neighboring metal vias of the third set of metal vias 54 is less under the center region CR than under the peripheral regions PR in each of the plurality of one-dimensional arrays.

Figure 4:
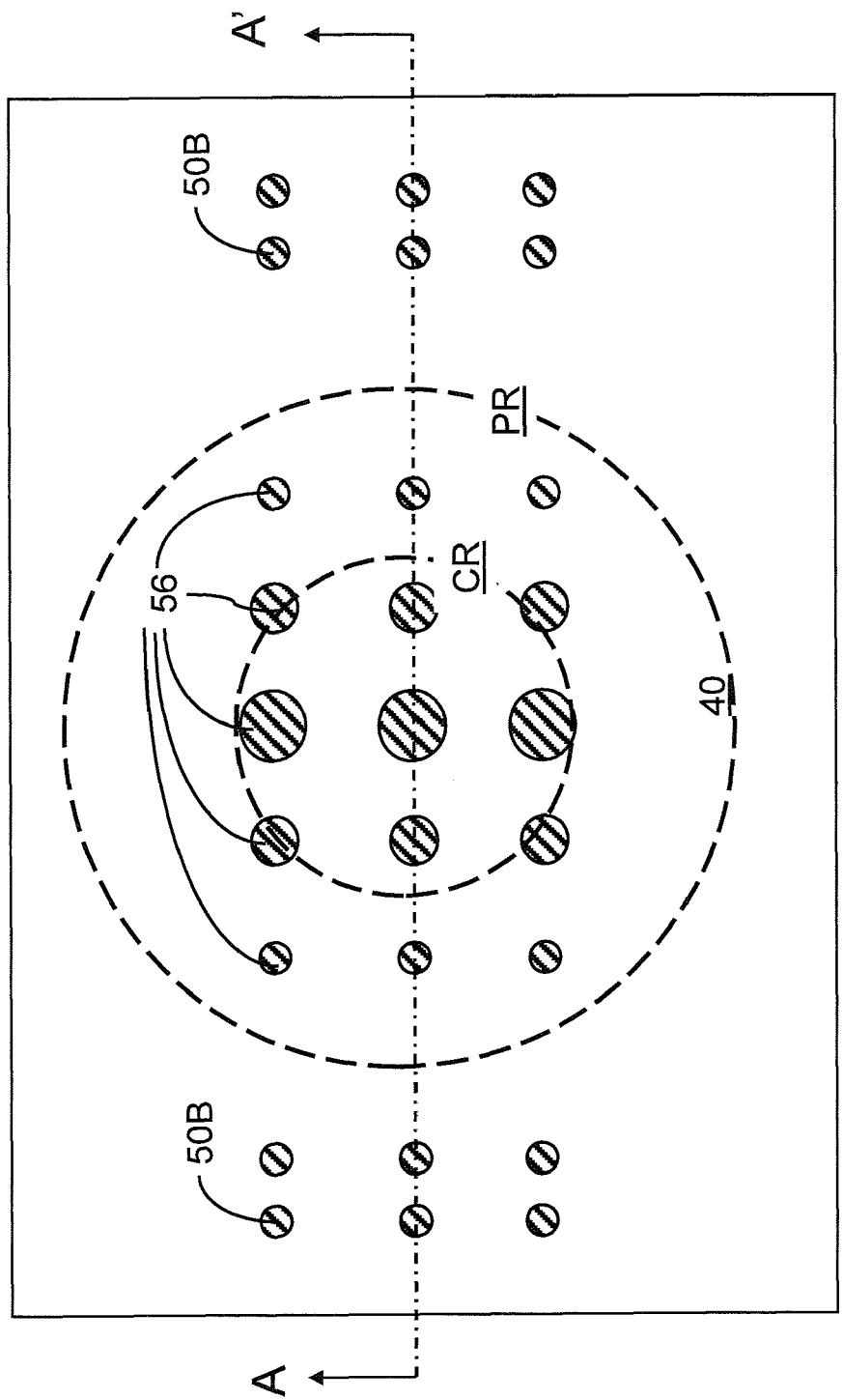
FIG. 4 is a horizontal cross-sectional view of a fourth exemplary structure that employs a fourth set of metal vias in a plane corresponding to FIG. 1D according to the present invention.

Referring to FIG. 4, a fourth exemplary structure according to a fourth embodiment of the present invention is shown. The fourth exemplary structure is derived from the first exemplary structure by substituting a fourth set of metal vias 56 for the first set of metal vias 50A of the first embodiment. FIG. 4 is a horizontal cross-sectional view of the fourth exemplary structure in a plane corresponding to FIG. 1D of the first exemplary structure.

The fourth set of metal vias 56 includes metal vias having different sizes. Specifically, metal vias located underneath the center region CR has a larger horizontal cross-sectional area than metal vias located underneath the peripheral regions PR. The size of the metal vias in the fourth set of metal vias 56 may vary along one direction (for example, along the direction of the plane A-A') or with radius from a center point two-dimensionally.

In all embodiment described above, the areal density of the conductive area of a set of metal vias is greater underneath the center region CR of the contact area between the metal pad 90 and the C4 ball than underneath the peripheral regions PR. Preferably, the resistance of the set of metal vias is greater than the resistance of the upper level metal line structure 70A. The resistance of the set of metal vias is greater than the resistance of the upper level metal line structure 70A typically by a factor from 1.5 to 40, and preferably from 3 to 10, although lesser and greater ratios are also contemplated herein.

The effect of providing a greater areal density of conductive area underneath the center region CR than underneath the peripheral regions PR is to direct a higher fraction of the current through the upper level metal line structure 70A to the inside of the C4 ball 99 and to reduce the current along the surface of the C4 ball 99. This redistribution of electrical current has the effect of equalizing the current density through the C4 ball 99, thereby reducing the electromigration in the C4 ball 99 during the operation of a semiconductor chip.

Figure 5:
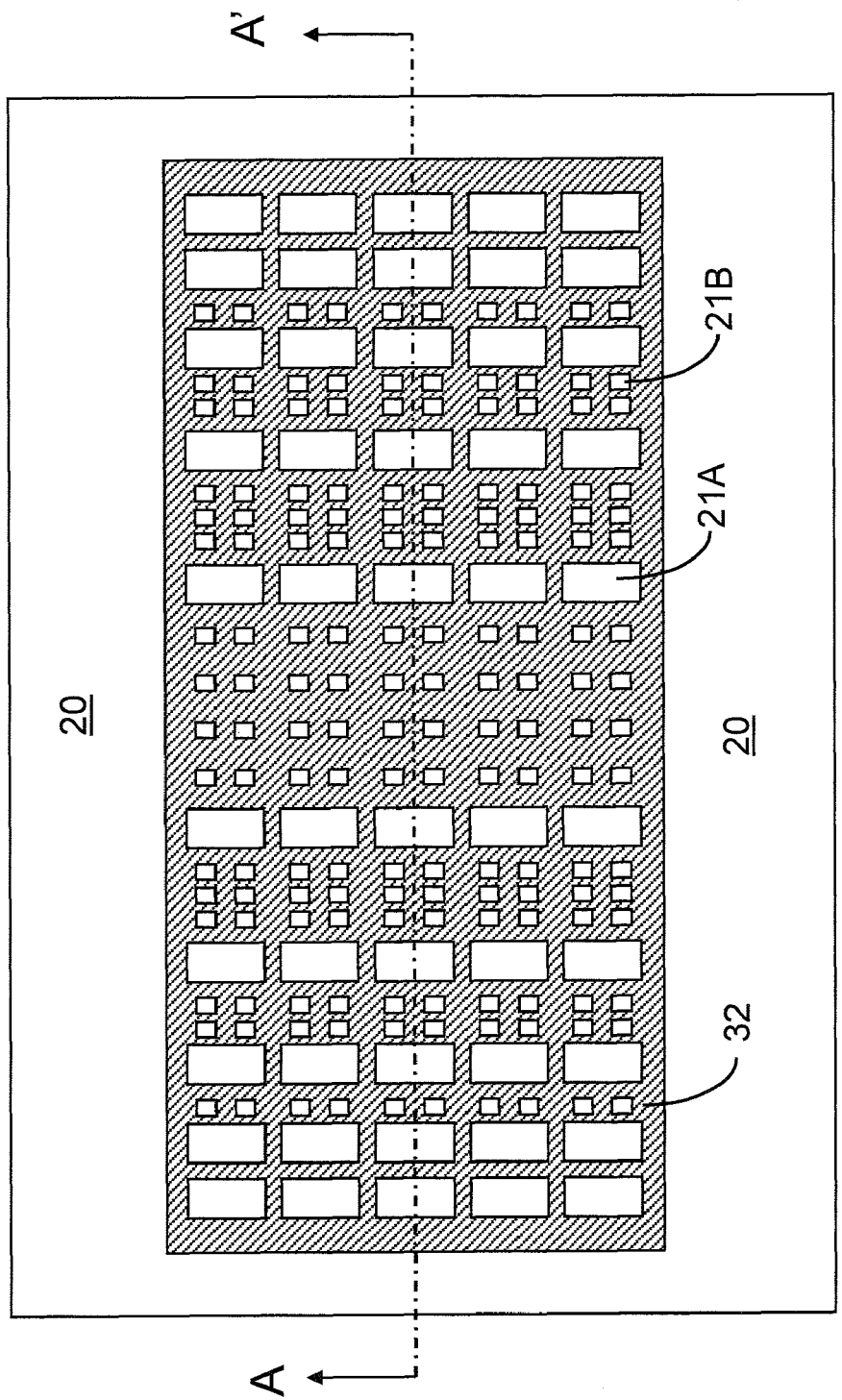
FIG. 5 is a horizontal cross-sectional view of a fifth exemplary structure that employs a second lower level metal line structure in a plane corresponding to FIG. 1E according to the present invention.

According to a fifth embodiment of the present invention, a fifth exemplary structure is derived from any of the first through fourth exemplary structures by substituting a second lower level metal line structure 32 for a first lower level metal line structure 30. Referring to FIG. 5, a horizontal cross-sectional view of the fifth exemplary structure is shown in a plane corresponding to FIG. 1E of the first embodiment. The second lower level metal line structure 32 may have substantially the same lateral dimensions and thickness as the first lower level metal line structure 30.

The second lower level metal line structure 32 includes holes, which are typically referred to as "cheesing holes." Each cheesing hole is filled with a dielectric material portion 21A, which has the same composition as the topmost layer of the at least one dielectric layer 20. The configuration of the cheesing holes is such that the second lower level metal line structure 32 includes unhindered straight conductive pathways running in a lengthwise direction (along the direction of the plane A-A') to the center portion of the second lower level metal line structure 32 separated by multiple cheesing hole regions. A set of metal vias, which may be one of the first through fourth set of metal vias (50A, 42, 54, 56) of the first through fourth embodiments of the present invention, overlie the multiple cheesing hole regions. The placement of the metal vias within the region of the cheesing holes in conjunction with the unhindered pathways facilitates the flow of electrical current between the inner region of the second lower level metal line structure 32 and a contact area between the second lower level metal line structure 32 and the metal interconnect structure (22, 24; See FIG. 1A) that may be present at a periphery of the second lower level metal line structure 32. Thus, more current may be flowed through the inner region of the C4 ball 99.

Figure 6:
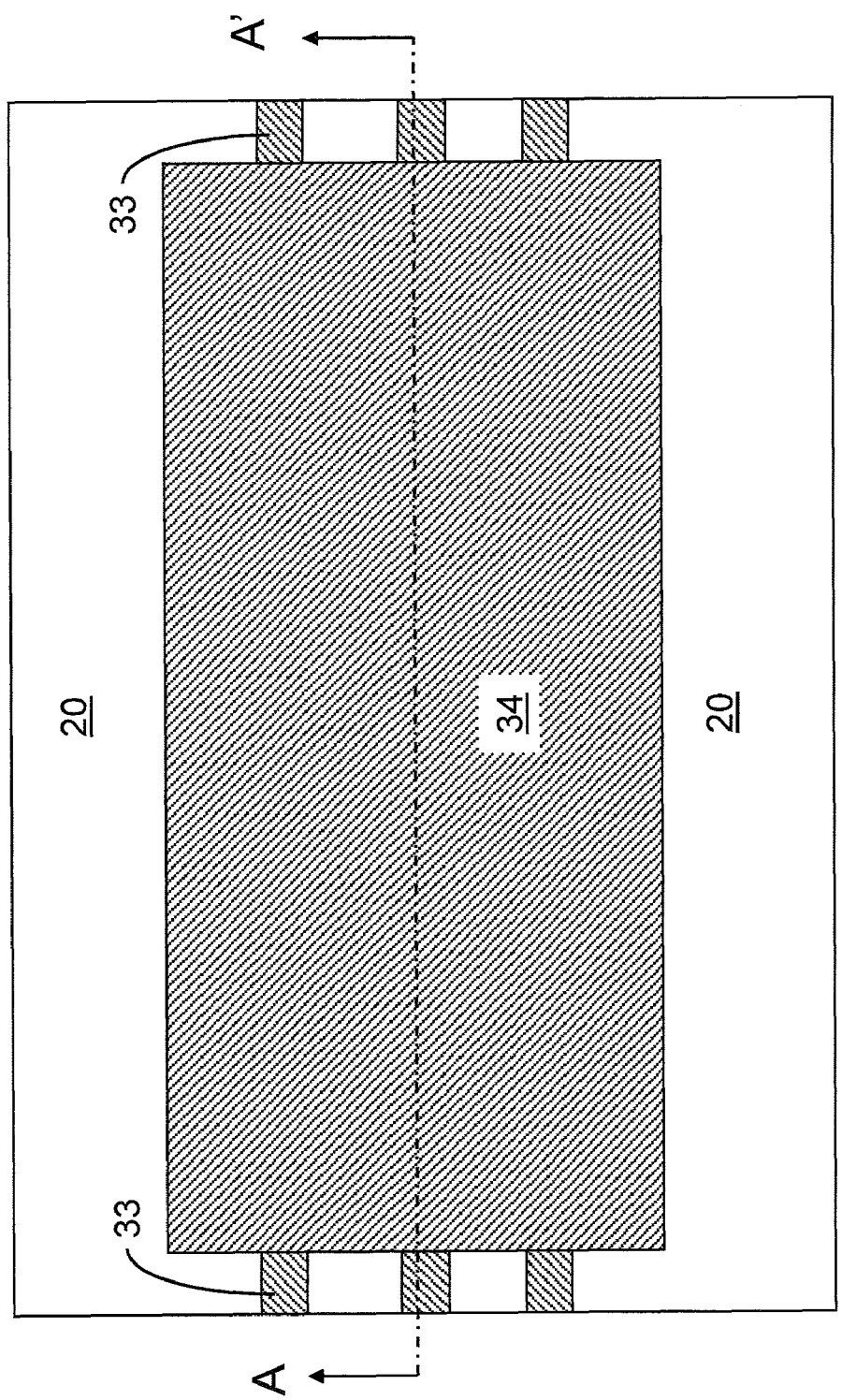
FIG. 6 is a horizontal cross-sectional view of a sixth exemplary structure that employs a third lower level metal line structure in a plane corresponding to FIG. 1E according to the present invention.

According to a sixth embodiment of the present invention, a sixth exemplary structure is derived from any of the first through fourth exemplary structures by substituting a third lower level metal line structure 34 for a first lower level metal line structure 30. Referring to FIG. 6, a horizontal cross-sectional view of the sixth exemplary structure is shown in a plane corresponding to FIG. 1E of the first embodiment. The third lower level metal line structure 34 may have substantially the same lateral dimensions and thickness as the first lower level metal line structure 30. Lower level metal wires 33 provide an electrically conductive path between the third lower level metal line structure 34 and the metal interconnect structure (22, 24; See FIG. 1A).

Figure 7:
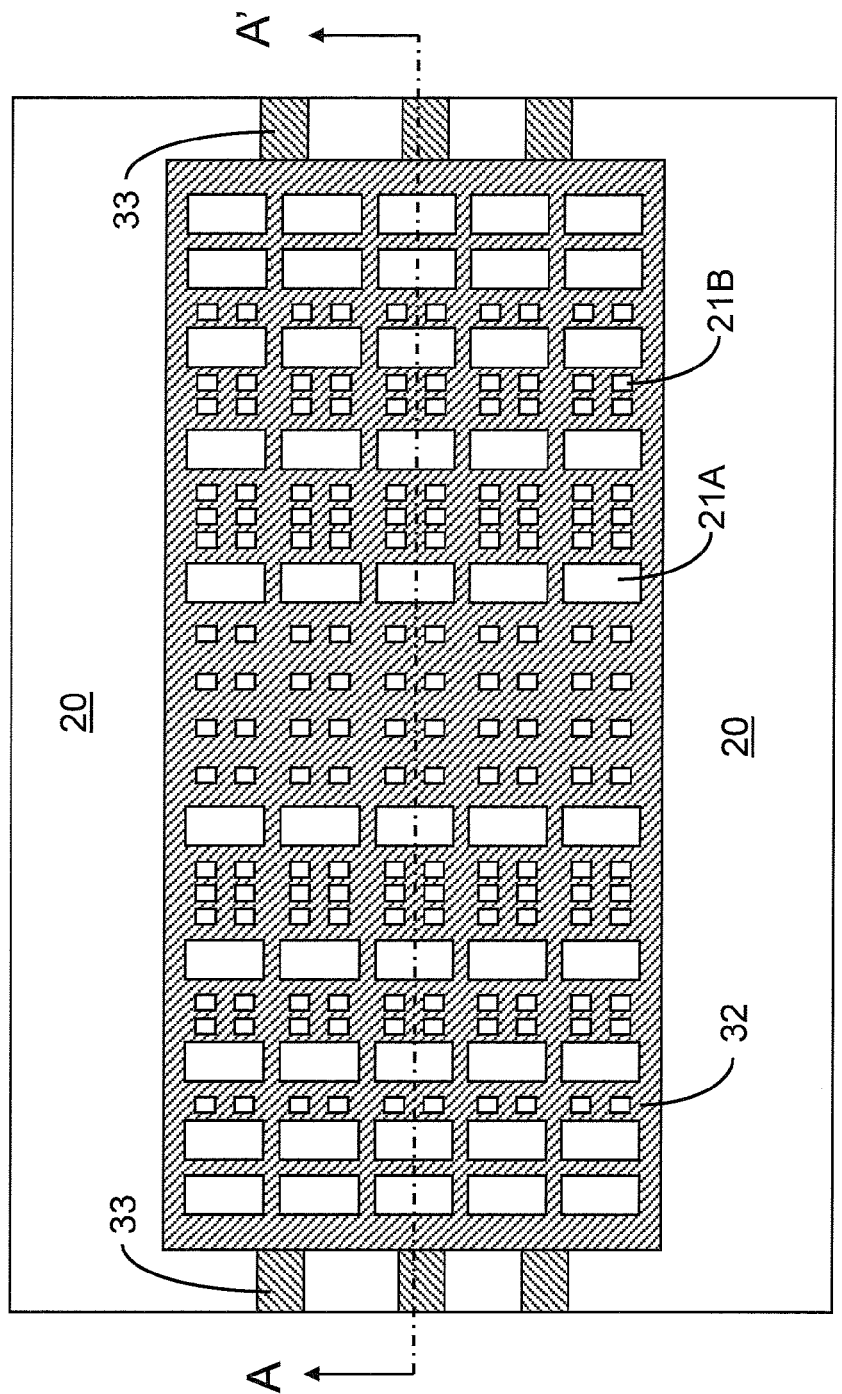
FIG. 7 is a horizontal cross-sectional view of a seventh exemplary structure that employs a fourth lower level metal line structure in a plane corresponding to FIG. 1E according to the present invention.

According to a seventh embodiment of the present invention, a seventh exemplary structure is derived from any of the first through fourth exemplary structures by substituting the second lower level metal line structure 32 for a first lower level metal line structure 30 and employing lower level metal wires 33 to provide an electrically conductive path between the second lower level metal line structure 32 and the metal interconnect structure (22, 24). Referring to FIG. 7, a horizontal cross-sectional view of the seventh exemplary structure is shown in a plane corresponding to FIG. 1E of the first embodiment. The fourth lower level metal line structure 36 may have substantially the same lateral dimensions and thickness as the first lower level metal line structure 30.

Figure 8:
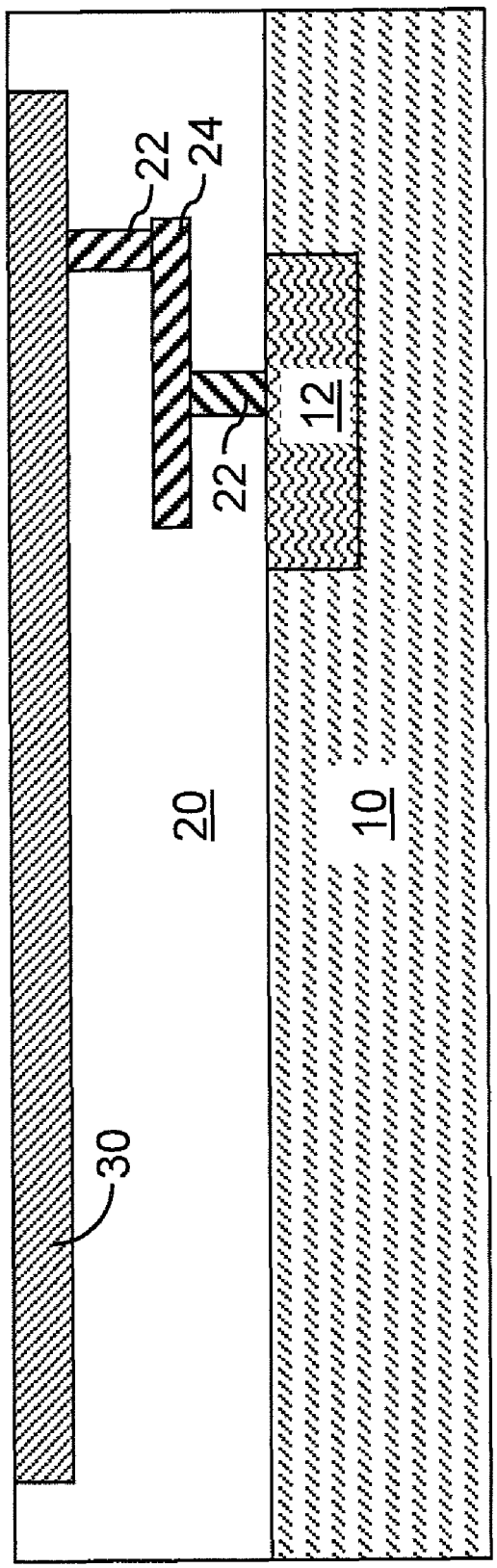
FIG. 8 is a vertical cross-sectional view of the first exemplary semiconductor structure after formation of a lower level metal line structure.

Referring to FIG. 8, a method of forming the first exemplary structure of the present invention is shown. At least one semiconductor device 12 formed in a substrate 10 as well known in the art. The substrate 10 may be a semiconductor substrate as described above.

At least one dielectric layer 20 and a metal interconnect structure including interconnect level metal vias 22 and interconnect level metal lines 24 are formed by successive semiconductor processing steps of deposition and patterning. The first lower level metal line structure 30 formed within the topmost layer of the at least one dielectric layer 20 and planarized. After planarization, a substantially planar surface is obtained across the least one dielectric layer 20 (which includes the topmost layer) and the first lower level metal line structure 30. The first lower level metal line structure 30 may, or may not, include cheesing holes as discussed above.

Figure 9:
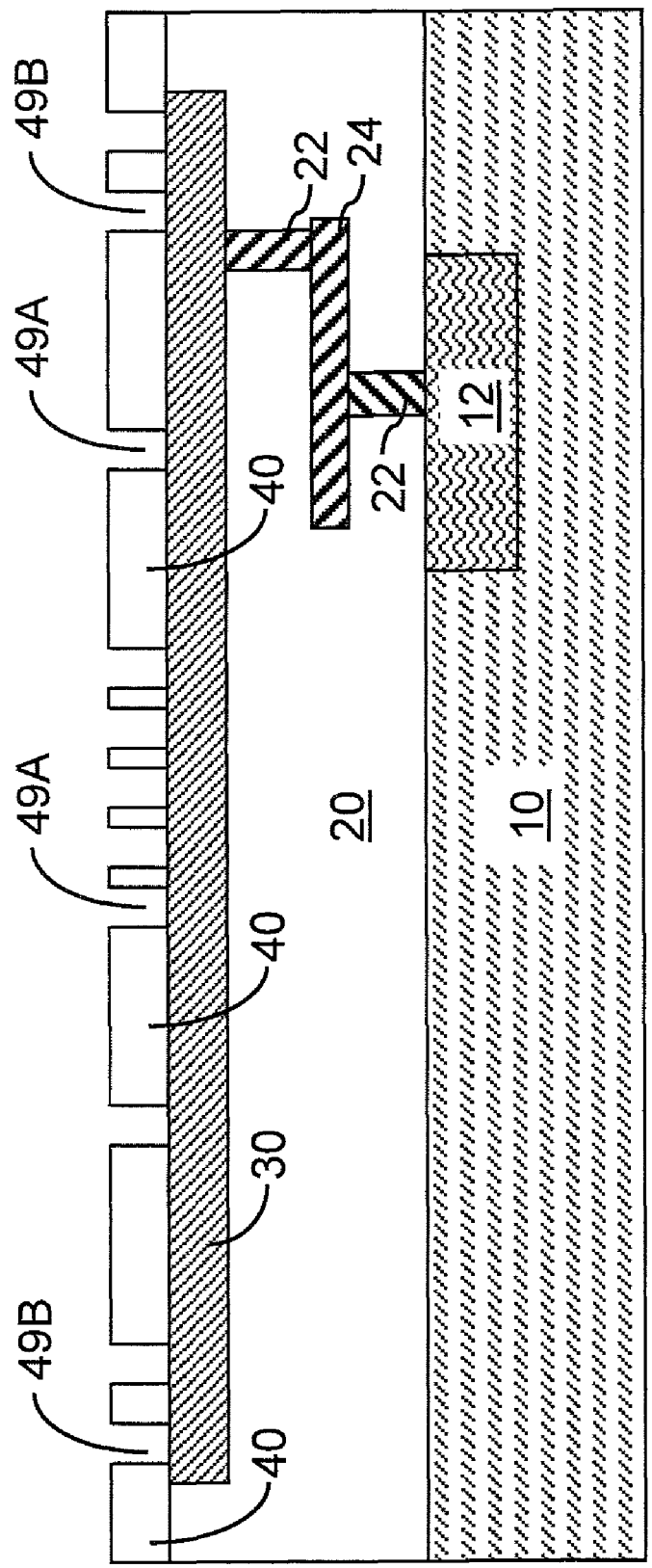
FIG. 9 is a vertical cross-sectional view of the first exemplary semiconductor structure after formation of a lower level metal line structure and a via level dielectric layer containing via holes.

Referring to FIG. 9, the via level dielectric layer 40 is formed over the first lower level metal line structure 30. The via level dielectric layer 40 is subsequently patterned to form first via holes and second via holes. The first via holes 49A have the pattern of the first set of metal vias 50A. Alternately, the first via holes may have the pattern of the second set of metal vias 52, the third set of metal vias 54, the fourth set of metal vias 56, or a combination thereof in other embodiments. The second via holes 49B are optional and may be employed to provide additional electrical wiring to a lower level metal line structure to be subsequently formed.

Figure 10:
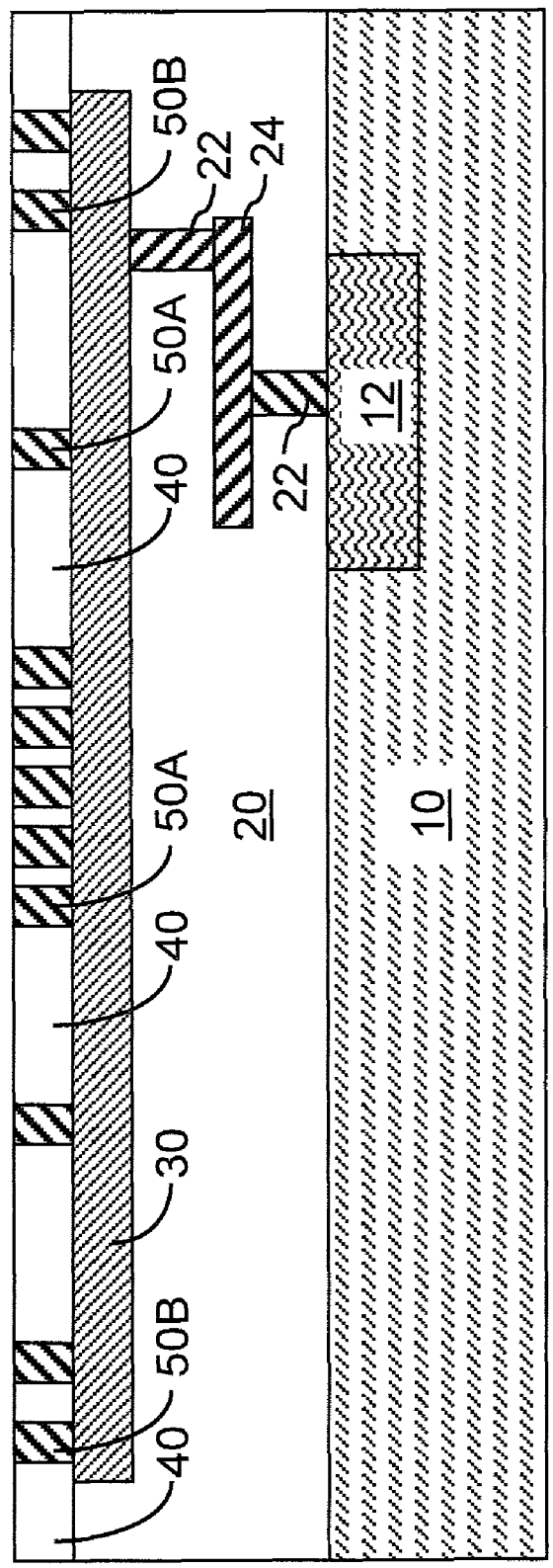
FIG. 10 is a vertical cross-sectional view of the first exemplary semiconductor structure after formation of a set of metal vias within the via level dielectric layer.

Referring to FIG. 10, the first via holes 49A are filled with conductive metal such as copper. The metallic fill material in the first via holes 49A is planarized to form the first set of metal vias 50A. Interconnect vias 50B may optionally be formed by filling the second via holes 49B with the conductive metal.

Figure 11:
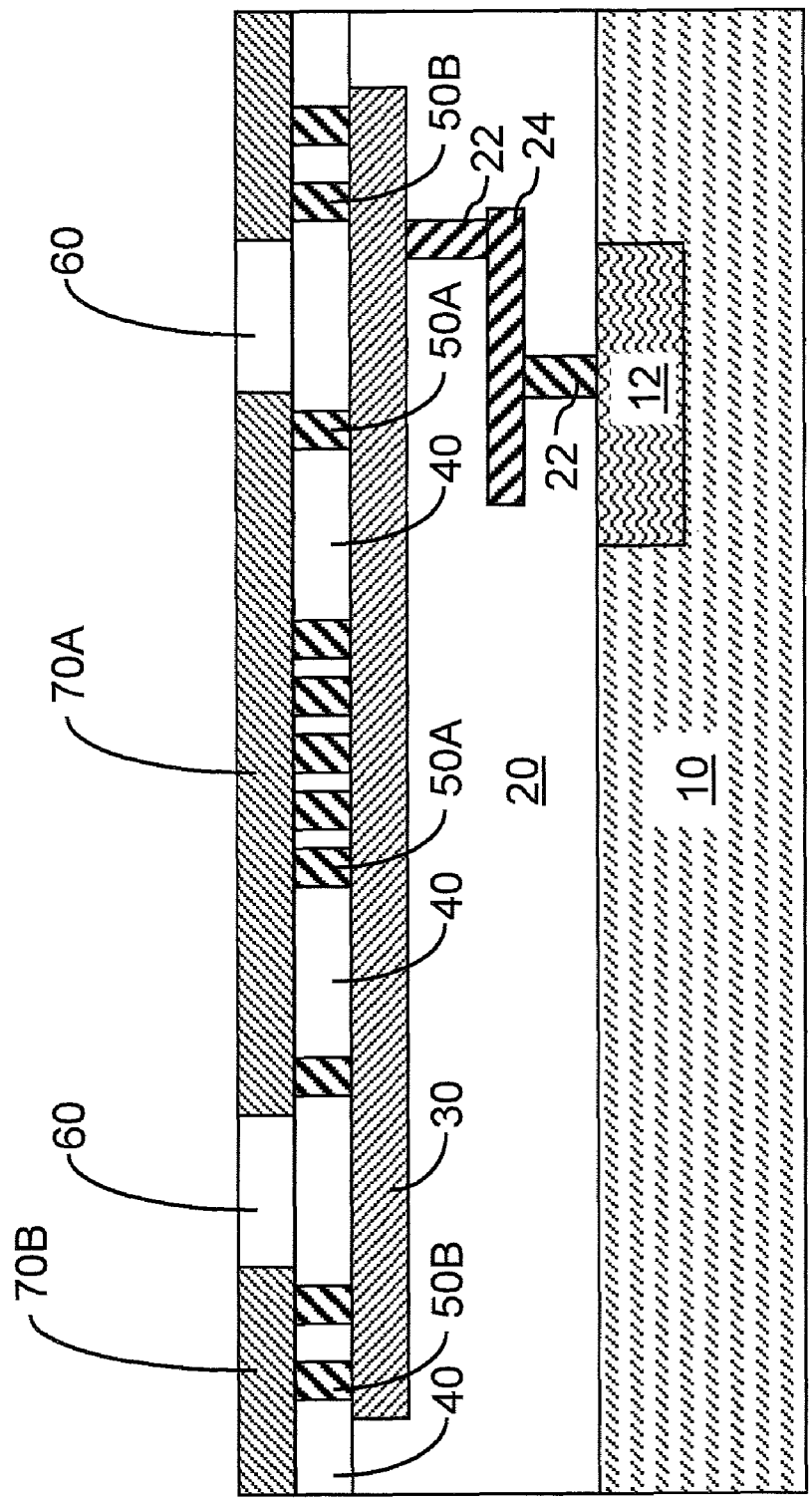
FIG. 11 is a vertical cross-sectional view of the first exemplary semiconductor structure after formation of an upper level metal line structure.

Referring to FIG. 11, the upper level metal line structure 70A is formed by deposition of the line level dielectric layer 60, patterning of the line level dielectric layer 60, filling the recessed area in the line level dielectric layer 60 with a conductive metal, and planarizing the conductive metal. Optionally, the upper level metal wiring lines 70B may be formed at the same time.

Figure 12:
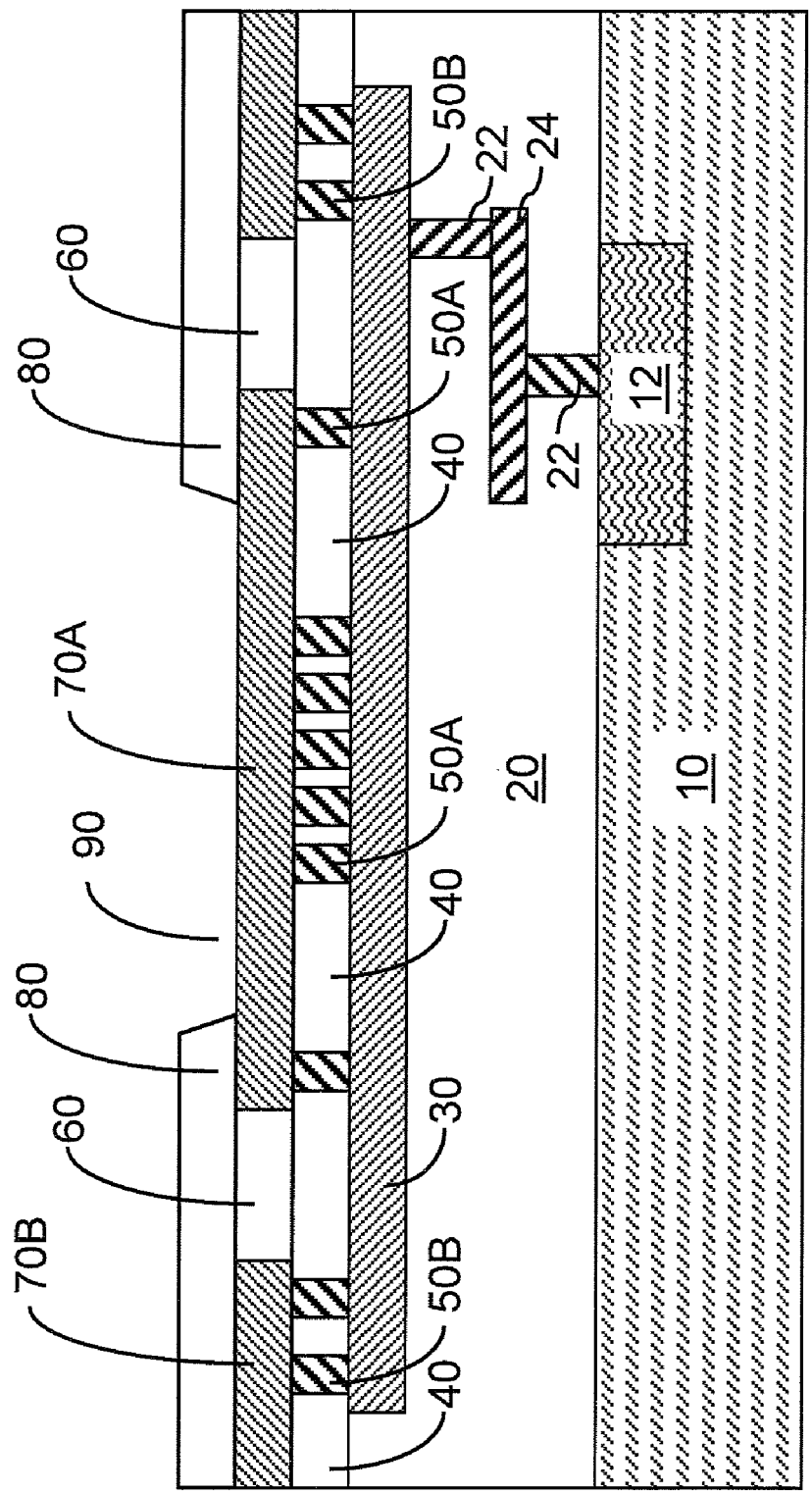
FIG. 12 is a vertical cross-sectional view of the first exemplary semiconductor structure after formation of a passivation dielectric layer and an opening therein.

Referring to FIG. 12, the passivation dielectric layer 80 is deposited and patterned to form at least one opening therein over the upper level metal line structure 70A.

Figure 13:
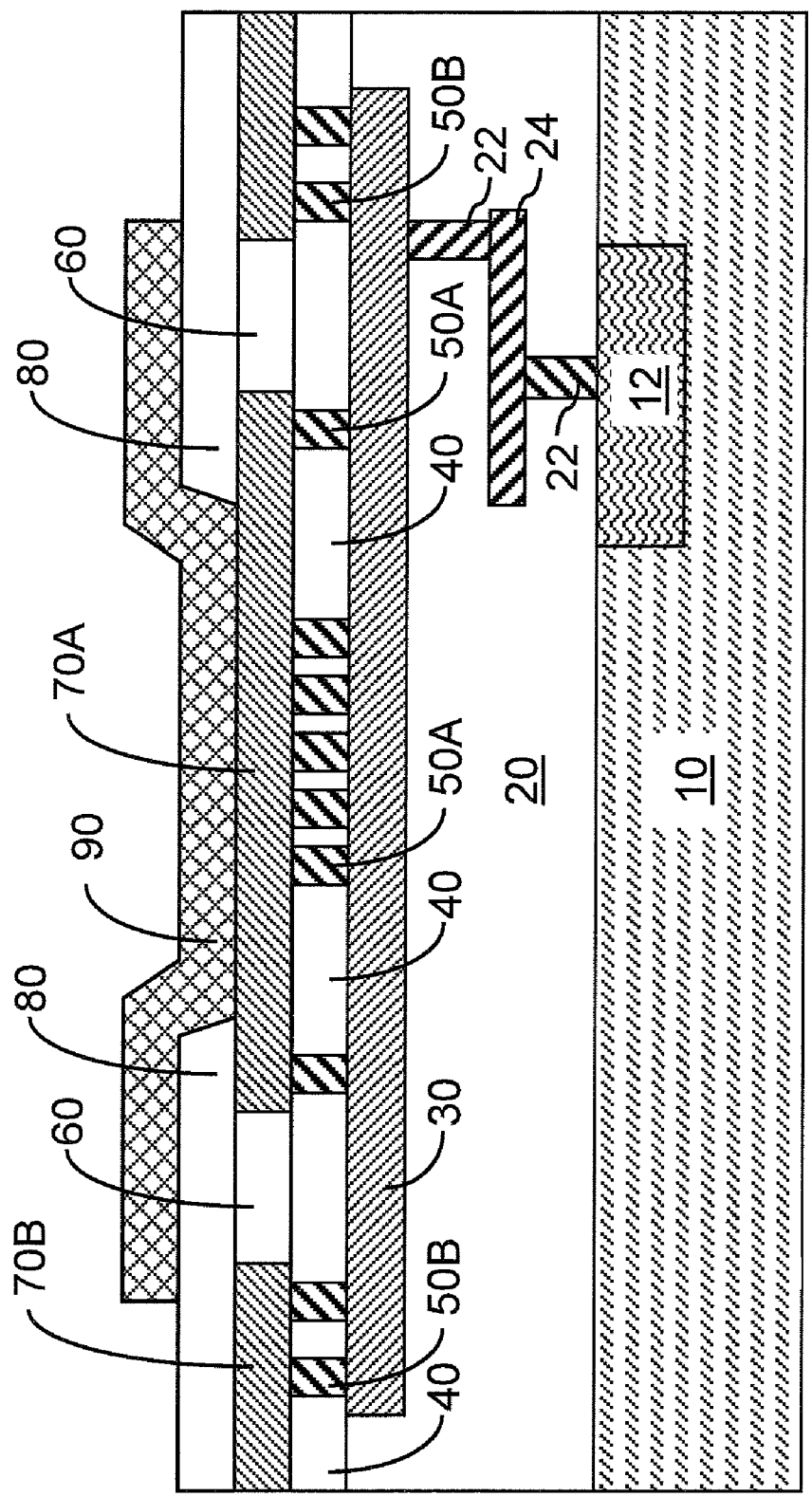
FIG. 13 is a vertical cross-sectional view of the first exemplary semiconductor structure after formation of a metal pad.

Referring to FIG. 13, the metal pad 90 is formed by depositing a metal layer such as an aluminum layer and lithographically patterning the metal layer. The area of the metal pad 90 includes the entirety of the area of the opening in the passivation dielectric layer 80.

Figure 14:
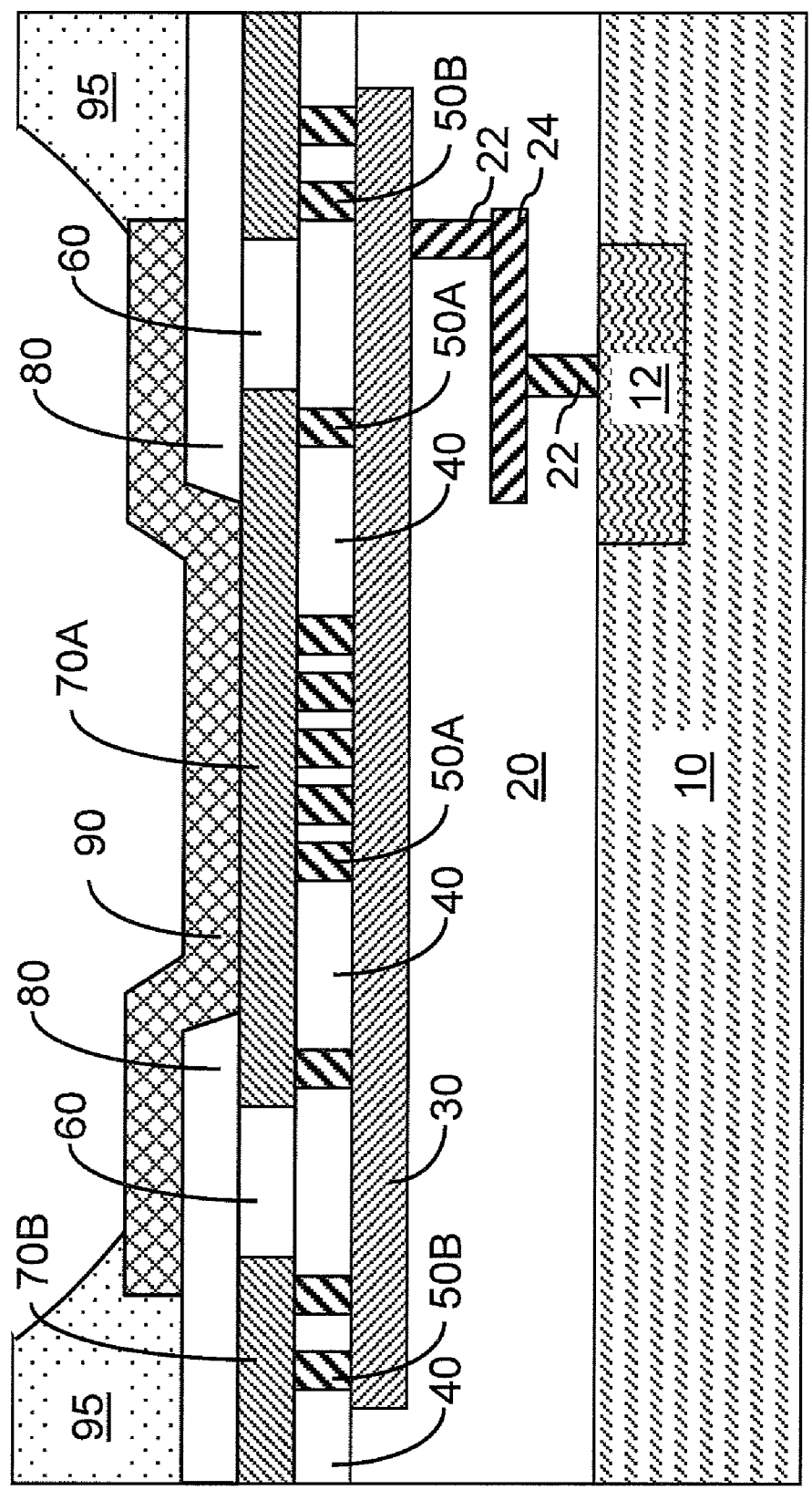
FIG. 14 is a vertical cross-sectional view of the first exemplary semiconductor structure after formation of a topmost dielectric layer and an opening therein.
Figure 15A:
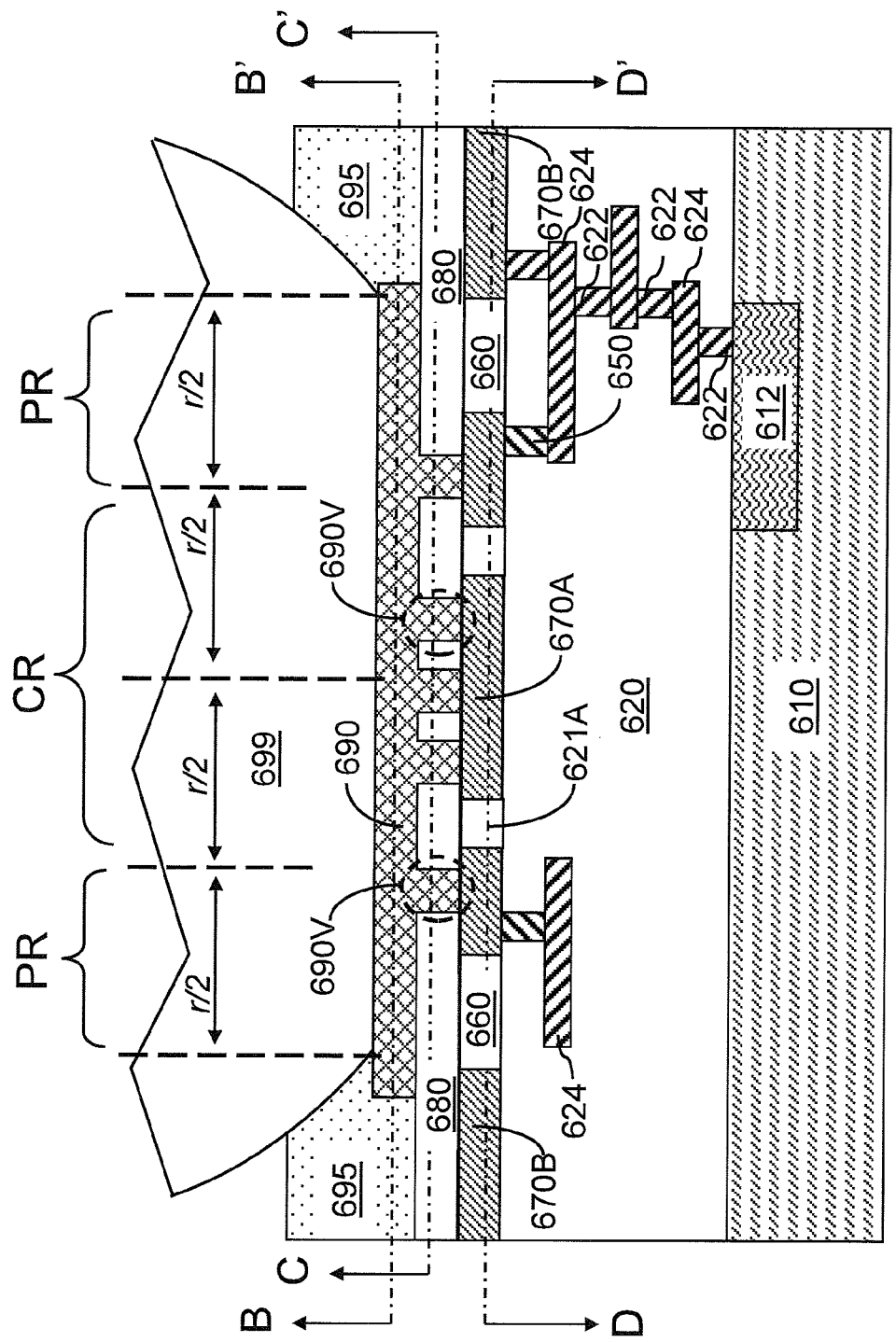
FIGS. 15A-15D are cross-sectional views along the planes A-A', B-B', C-C', and D-D', respectively, of an eighth exemplary structure that employs a metal pad including an array of metal vias of a first type according to the present invention.
Figure 15B:
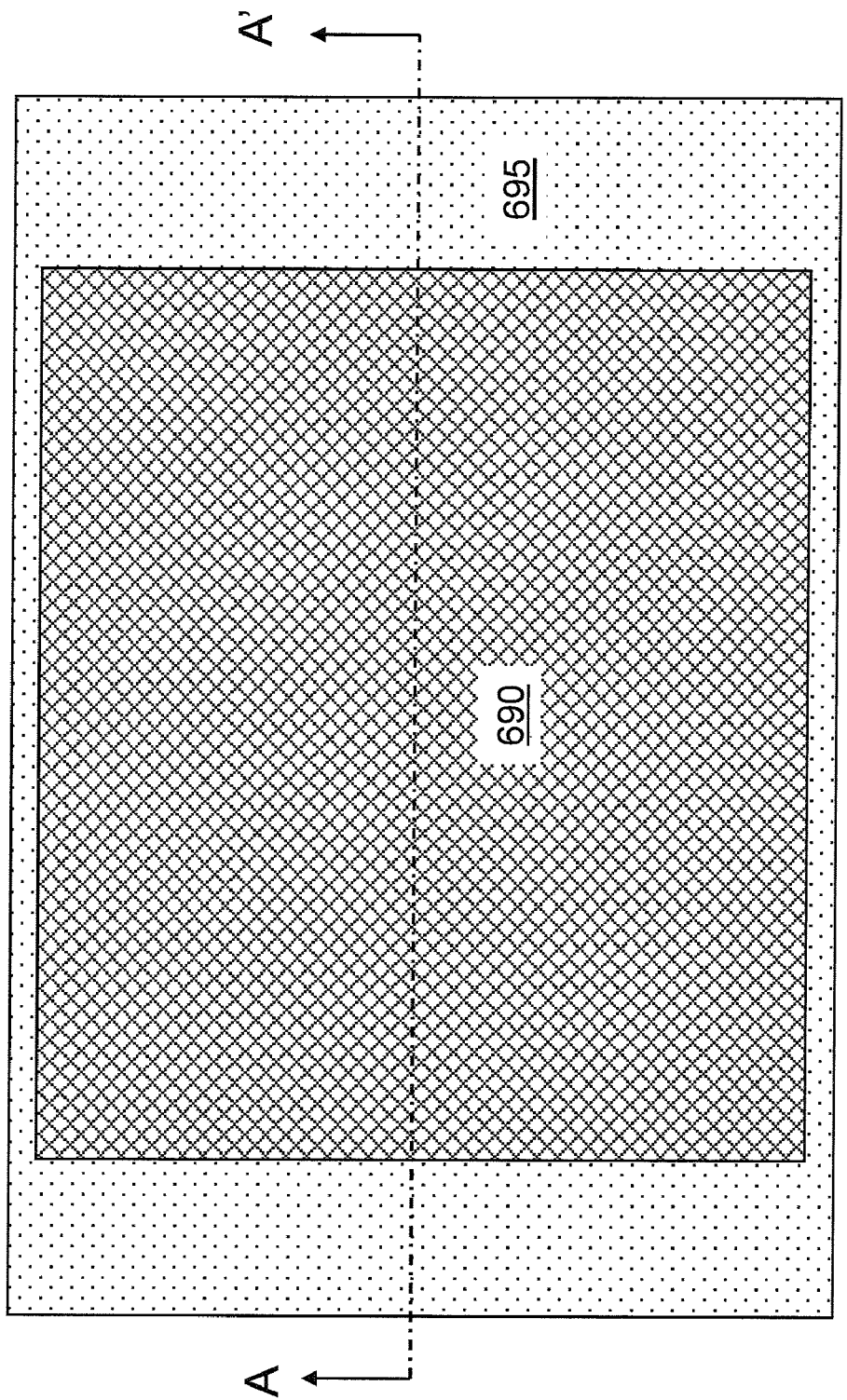
Figure 15C:
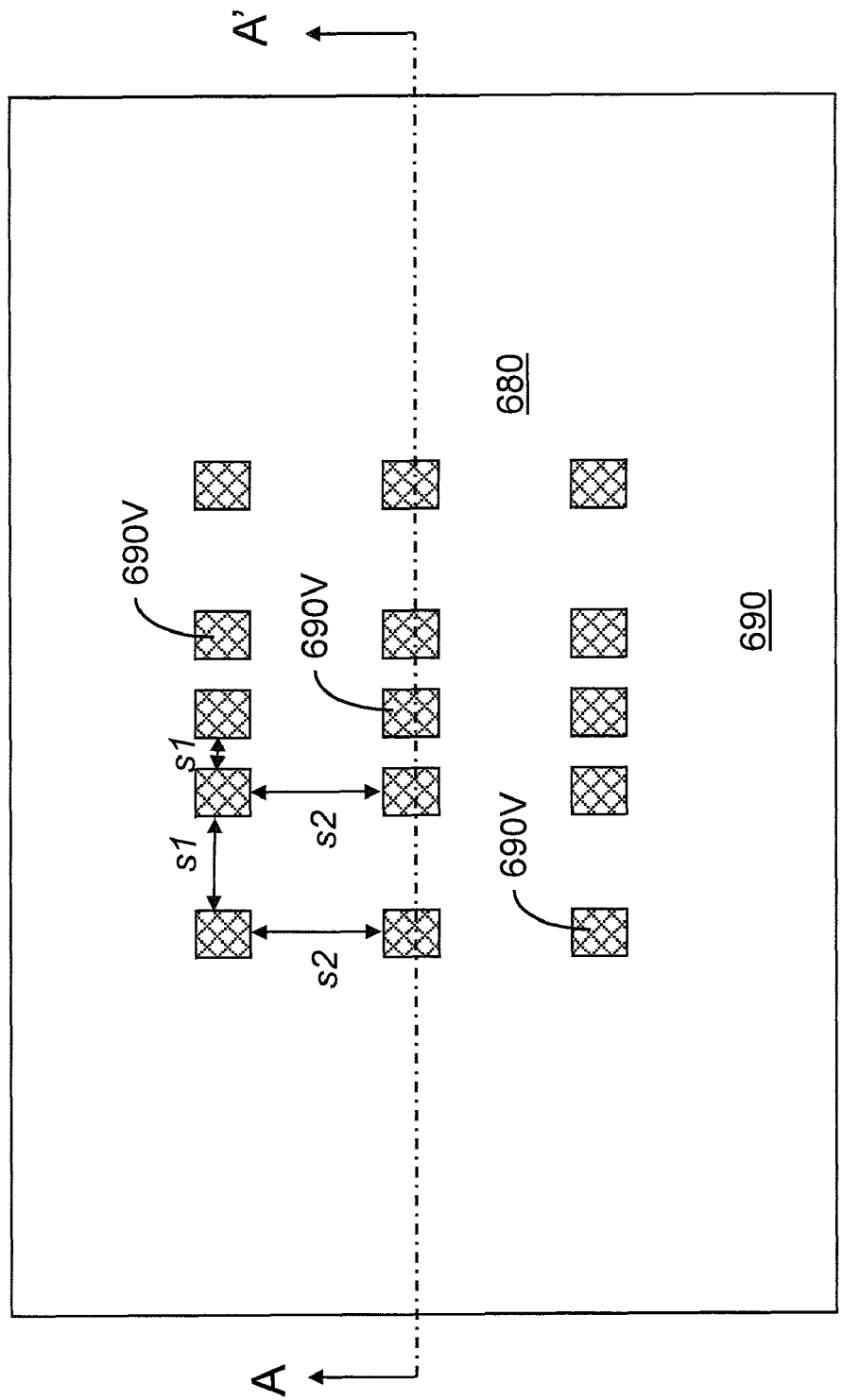
Figure 15D:
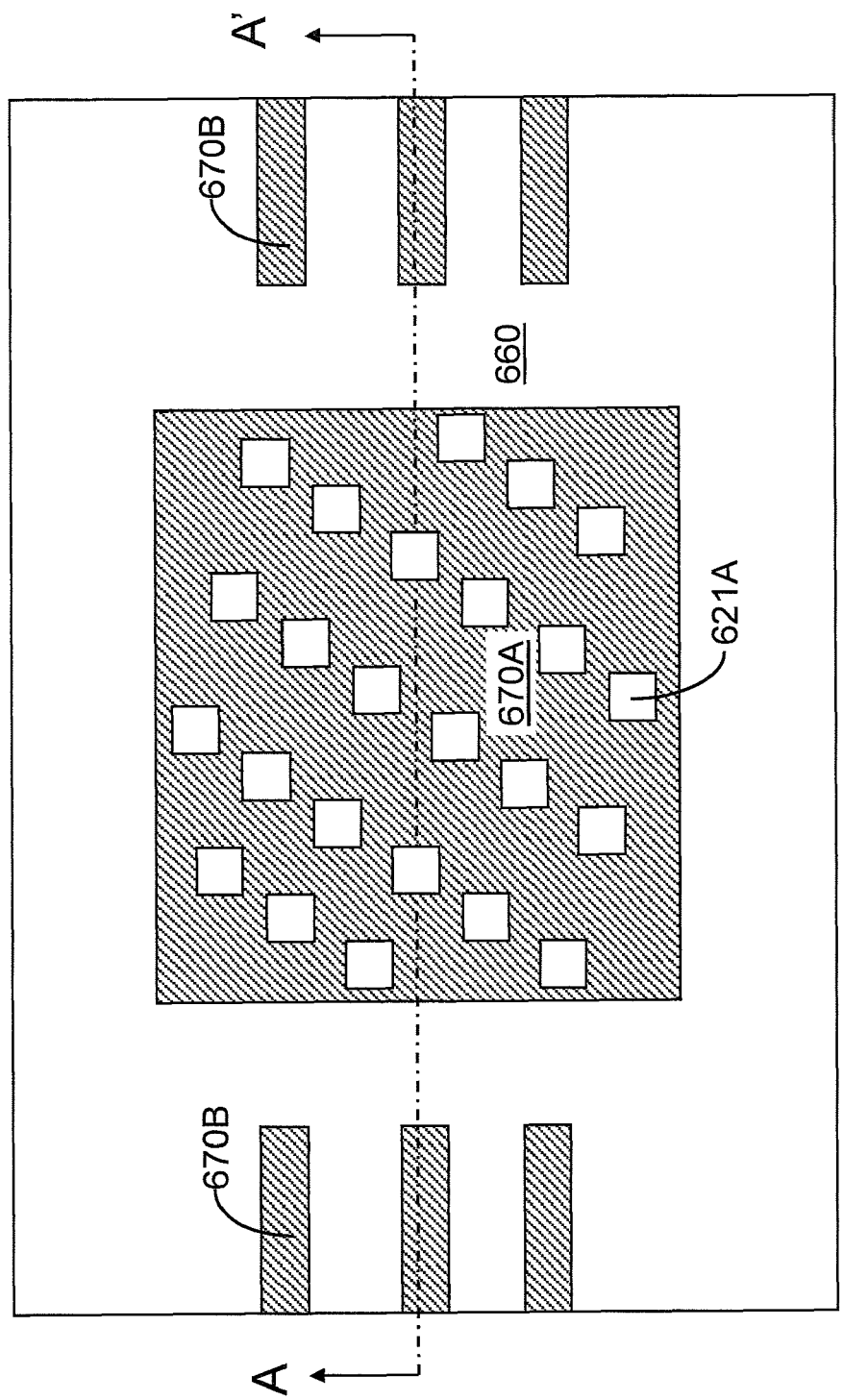

Referring to FIG. 14, the dielectric masking layer 95 is deposited over the metal pad 90 and the passivation dielectric layer 80. An opening in the dielectric masking layer 95 is formed within the area of the metal pad 90. Subsequently, a C4 ball 99 is placed on the exposed surfaces of the metal pad 90 to form the structure shown in FIGS. 1A-1E.

While the first exemplary structure is employed to illustrate the methods of manufacturing the first exemplary structure according to the present invention, the same method may be employed to form structures according to all other embodiments of the present invention as well.

Referring to FIGS. 15A-15D, an eighth exemplary structure according to an eighth embodiment of the present invention is shown. The eighth exemplary structure includes a substrate 610 and at least one semiconductor device 612 formed therein. The substrate 610 may be a semiconductor substrate comprising a semiconductor material such as silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. The substrate may be a single crystalline semiconductor substrate.

The at least one semiconductor device 612 may include at least one of a field effect transistor, a bipolar transistor, a diode, a resistor, a capacitor, and an inductor. At least one dielectric layer 620 is located on the at least one semiconductor device 612. The at least one dielectric layer 620 may comprise a dielectric oxide such as silicon oxide, a dielectric nitride such as silicon nitride, a low dielectric constant (low-k) chemical vapor deposition (CVD) dielectric material, or a spin-on low-k dielectric material. A metal interconnect structure is embedded in the at least one dielectric layer 620. The metal interconnect structure may include interconnect level metal vias 622 and interconnect level metal lines 624. The metal interconnect structure may further include topmost interconnect vias 50 having top surfaces that are coplanar with the topmost surface of the at least one dielectric layer 620.

A line level dielectric layer 660 is located over the at least one dielectric layer 620. The line level dielectric layer 660 may comprise a dielectric oxide, a dielectric nitride, a low-k CVD dielectric material, a low-k spin-on dielectric material, or a combination thereof. Preferably, the line level dielectric layer 660 includes a dielectric oxide, a dielectric nitride, or a combination thereof to reduce ingress of oxygen or moisture to the at least one dielectric layer 620 located below.

A metal line structure 670A and metal wiring lines 670B are embedded in the line level dielectric layer 660. The metal line structure 670A may have lateral dimensions from 20 microns to 200 microns, although lesser and greater dimensions are also contemplated herein. In case the metal line structure 670A has a rectangular shape, the width and length of the metal line structure 670A may be from 20 microns to 200 microns, respectively. The thickness of the metal line structure 670A is typically from 150 nm to 1,500 nm, although lesser and greater thicknesses are also contemplated herein. The metal line structure 670A and the metal wiring lines 670B include at least one metal. The metal line structure 670A and the metal wiring lines 670B may consist essentially of copper or aluminum. Preferably, the metal line structure 670A and the metal wiring lines 670B consist essentially of copper. The metal line structure 670A may include holes, which are typically referred to as "cheesing holes." Each cheesing hole is filled with a dielectric material portion 621A, which has the same composition as the line level dielectric layer 660.

A passivation dielectric layer 680 and a metal pad 690 are located over the line level dielectric layer 660, the metal line structure 670A, and the metal wiring lines 670B. The passivation dielectric layer 680 includes a dielectric oxide, a dielectric nitride, or a combination thereof. Preferably, the passivation dielectric layer 680 includes a stack of a dielectric oxide and a dielectric nitride. Typically, the passivation dielectric layer 680 has a thickness from 300 nm to 3,000 nm, although lesser and greater thicknesses are also contemplated herein.

The metal pad 690 includes an upper planar portion and a plurality of metal vias 690V that extend downward. The metal pad 690 is of integral and unitary construction, i.e., in one piece, and may be disposed over the metal interconnect structure (622, 624, 650). The plurality of metal vias 690V is laterally surrounded by the passivation dielectric layer 680 and abuts the metal line structure 670A. The upper planar portion of the metal pad 690 refers to the portion of the metal pad 690 that is located above the top surface of the passivation dielectric layer 680. The upper planar portion is located on and above the passivation dielectric layer 680 and the plurality of metal vias 690V. The metal pad 690 contains at least one metal. In one case, the metal pad 690 may consist essentially of aluminum, and the metal line structure 670A may consist essentially of copper. The thickness of the metal pad 690 may be from 1.0 micron to 5.0 microns, although lesser and greater thicknesses are also contemplated herein.

A dielectric masking layer 695 with an opening is located over the metal pad 690 and the top surface of the passivation dielectric layer 680. The boundary of the opening is located within the area of the metal pad 690. The dielectric masking layer 695 includes a dielectric material such as polyimide. In some cases, the polyimide may be photosensitive to enable lithographic printing without employing additional photosensitive materials. A C4 ball 699 is located within the opening in the dielectric masking layer 695 and contacts the metal pad 690. The diameter of the C4 ball may be from 30 microns to 200 microns, although lesser and greater diameters are also contemplated herein. The metal pad 690 is resistively coupled to the at least one semiconductor device 612 through the metal line structure 670A and the metal interconnect structure (622, 624, 650).

The metal line structure 670A abuts bottom surfaces of the plurality of metal vias 690V. The plurality of metal vias 670A has a higher areal density of horizontal cross-sectional area underneath a center region CR of the metal pad 690 than underneath peripheral regions PR of the metal pad. The center region CR includes a center point of the contact area between the metal pad 690 and the C4 ball 699. In the present invention, the center region CR is defined as the subset of the area of the upper level metal line structure 670A that are closer to the center point of the contact area between the metal pad 690 and the C4 ball 699 than the closed boundary of the contact area. In case the contact area is a circle, the radius of the center region CR is one half of the radius r of the contact area. In case the upper level metal line structure 670A has a convex polygonal shape or a convex curvilinear shape, the area of the center region CR may be one eleventh of the area of the contact area between the metal pad 690 and the C4 ball 699. The peripheral regions PR are the complement of the center region CR within the contact area. The peripheral regions PR are areas within the closed boundary of the contact area and outside the center region CR.

The plurality of metal vias 690V may include metal vias of substantially the same size. At least some of the metal vias of substantially the same size may be arranged in a one-dimensional array in which spacing between neighboring metal vias is less underneath the center region CR than underneath the peripheral regions PR. The metal vias of substantially the same size within the plurality of metal vias 690V may be arranged in a plurality of one-dimensional arrays having the same orientation, for example, in the direction of the plane A-A' in FIG. 1C.

The direction of each one-dimensional array is herein referred to as a first direction, and the direction separating the one-dimensional arrays is herein referred to as a second direction. The spacing in the direction of each one-dimensional array is herein referred to as a first spacing s1, which is a spacing along the first direction, and the spacing between adjacent one-dimensional array is herein referred to as a second spacing s2, which is a spacing along the second direction. The first spacing s1 between neighboring metal vias is less under the center region CR than under the peripheral regions PR along the first direction.

A first spacing s1 between neighboring metal vias is less in a middle portion than in end portions in each of the plurality of one-dimensional arrays. Each metal via in the plurality of metal vias 690V may have a cross-sectional area of a circle or a rectangle. In general, each via in the plurality of metal vias 690V may have any polygonal or curvilinear closed shape.

The plurality of metal vias 690V may be arranged in a two-dimensional array in which the first spacing s1 between neighboring metal vias is less under the center region CR than under the peripheral region PR along the first direction. The second spacing s2 between neighboring metal vias is substantially the same among the plurality of metal vias 690V along the second direction, which is different from the first direction and may be perpendicular to the first direction.

Figure 16A:
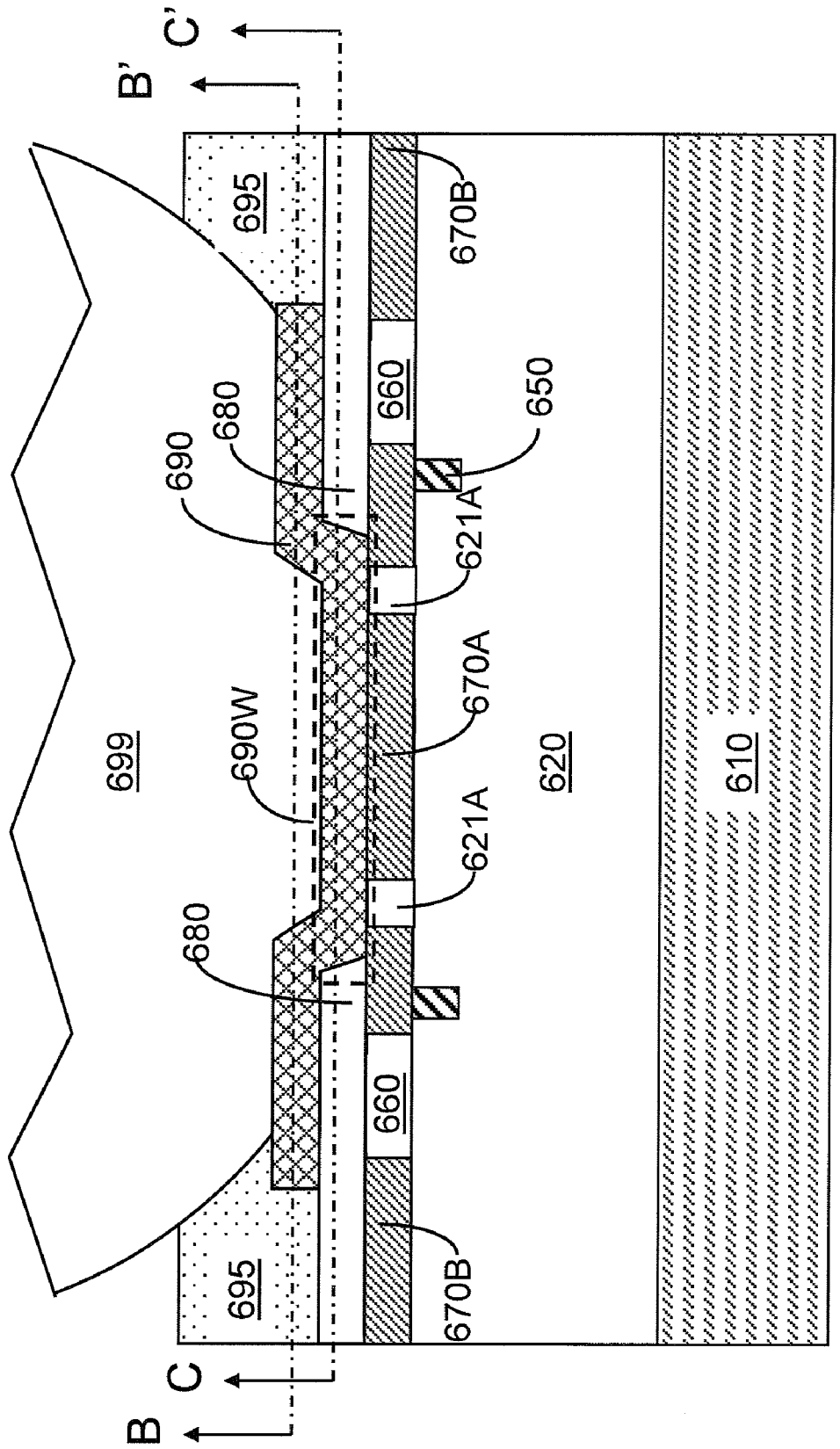
FIGS. 16A-16C are cross-sectional views along the planes A-A', B-B', and C-C', respectively, of a ninth exemplary structure that employs a metal pad including an array of metal vias of a second type according to the present invention.
Figure 16B:
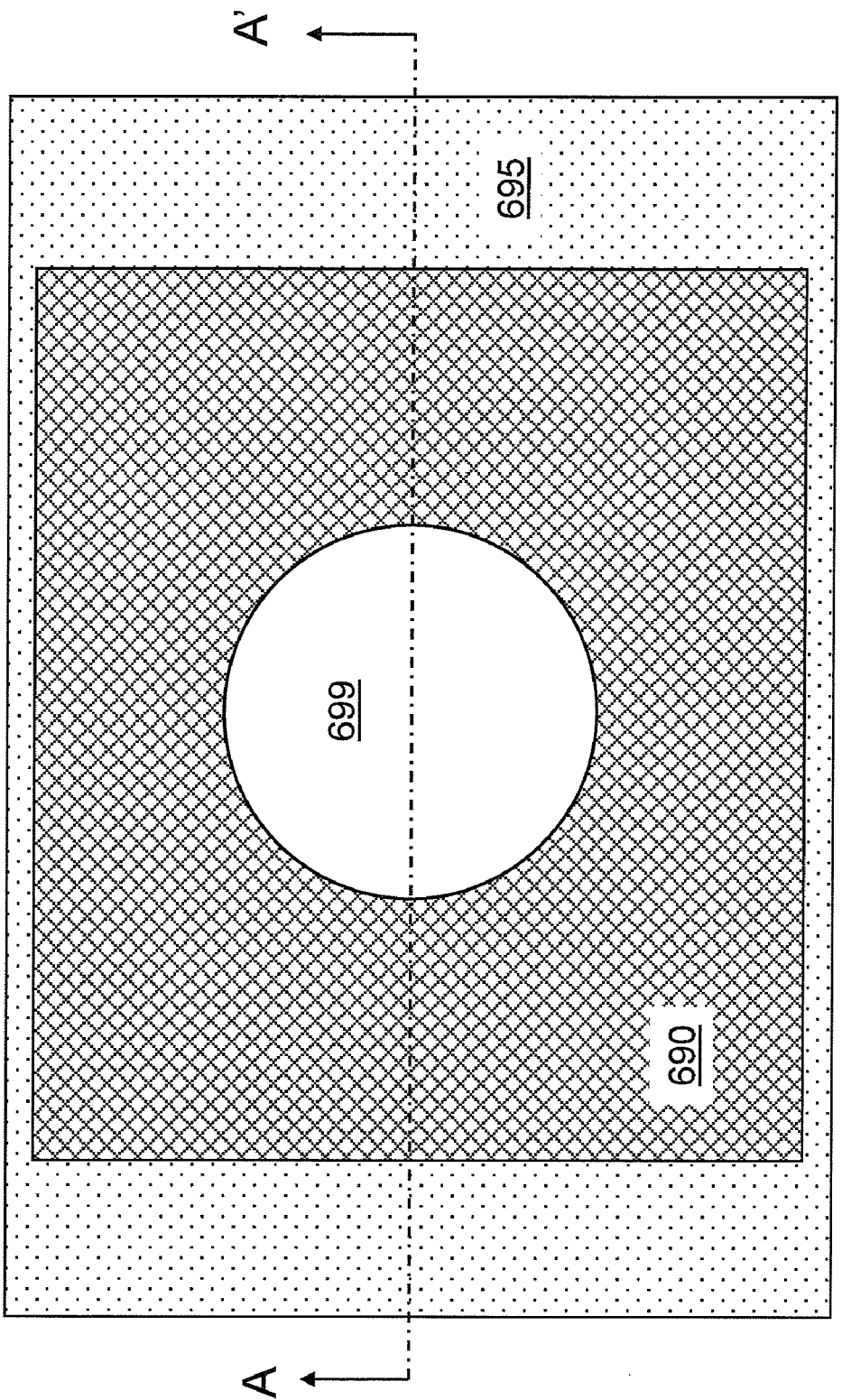
Figure 16C:
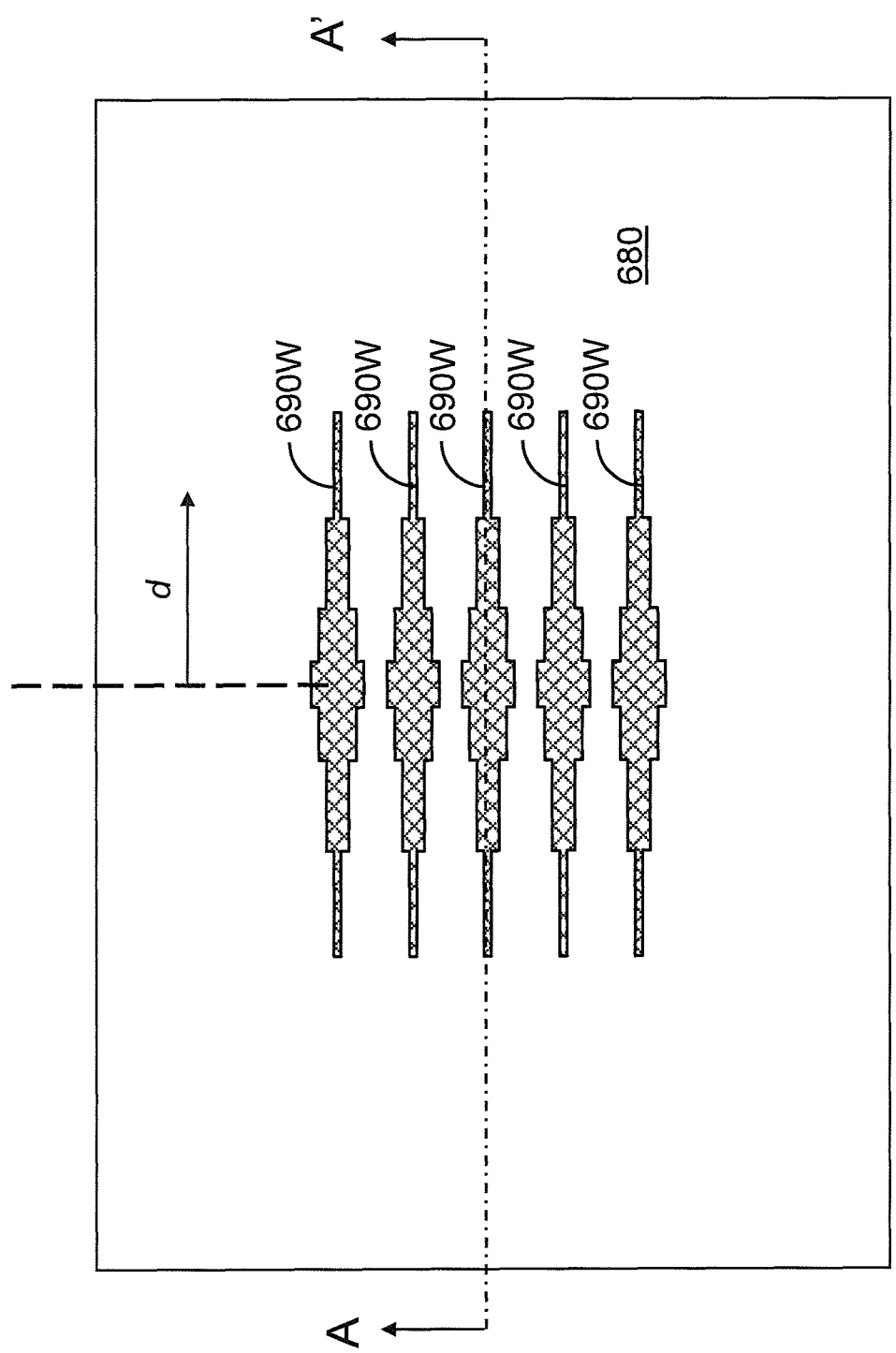

Different type of metal vias may be employed instead of the plurality of metal vias 690V of the eighth exemplary structure. Referring to FIGS. 16A-16C, a ninth exemplary structure according to a ninth embodiment of the present invention is shown. The ninth exemplary structure is derived from the eighth exemplary structure by substituting a plurality of metal vias 690W of a different type for the plurality metal vias 690V of the eighth embodiment.

The metal pad 690 includes at least one via portion 690W and an upper planar portion. The at least one via portion 690W is laterally surrounded by the passivation dielectric layer 680 and abuts the metal line structure 670A. The upper planar portion may be located on and above the passivation dielectric layer 680 and on the periphery of the at least one via portion 690W. The upper planar portion may include holes in the area above the at least one via portion 690W if the metal pad is recessed above the at least one via portion 690W from the topmost surface of the upper planar portion. The metal pad 690 contains at least one metal as in the eighth embodiment. In one case, the metal pad 690 may consist essentially of aluminum, and the metal line structure 670A may consist essentially of copper. The thickness of the metal pad 690 may be from 1.0 micron to 5.0 microns, although lesser and greater thicknesses are also contemplated herein.

Each metal via in the plurality of metal vias 690W has an elongated horizontal cross-sectional area. The horizontal width, which is the lateral dimension of a metal via in the direction perpendicular to the elongated direction, monotonically decreases with distance d from a center point in each of the plurality of metal vias 690W. The center point may be the geometric center of the shape of the horizontal area of a metal via in each of the plurality of metal vias 690W.

The horizontal width may decreases in steps with distance d from the center point along an elongated direction of each metal via in the plurality of metal vias 690W. The plurality of metal vias 690W may be arranged in a one-dimensional array along the direction of the horizontal width, i.e., along the direction perpendicular to the lengthwise direction of metal vias in the plurality of metal vias 690W.

Figure 17:
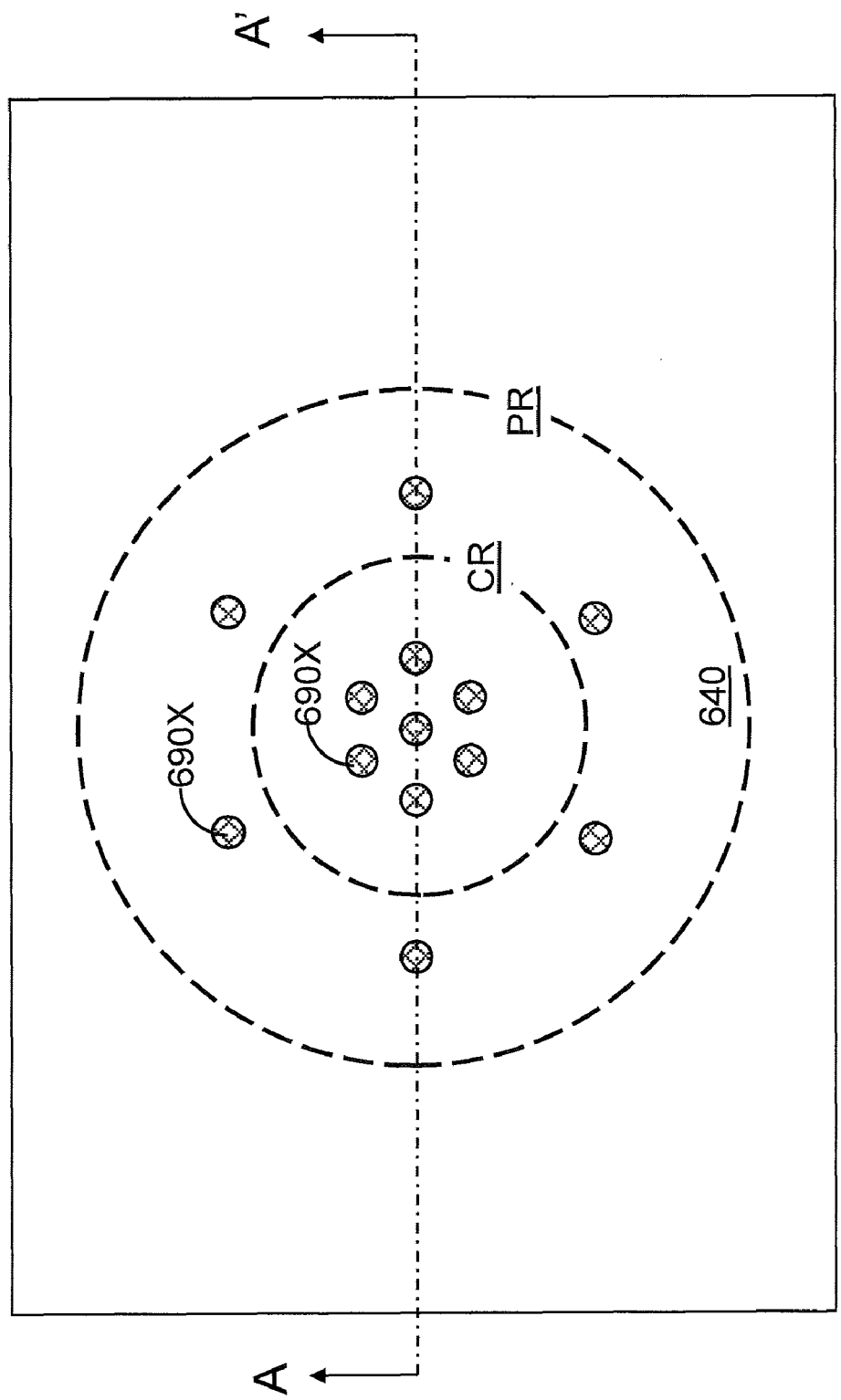
FIG. 17 is a horizontal cross-sectional view of a tenth exemplary structure that employs a metal pad including an array of metal vias of a third type in a plane corresponding to FIG. 15C or FIG. 16C according to the present invention.

Referring to FIG. 17, a tenth exemplary structure according to a tenth embodiment of the present invention is shown. The tenth exemplary structure is derived from the eighth or ninth exemplary structure by substituting a plurality of metal vias 690X of a different type for the plurality metal vias 690V of the eighth embodiment or for the plurality of metal vias 690W of the ninth embodiment. FIG. 17 is a horizontal cross-sectional view of the tenth exemplary structure in a plane corresponding to FIG. 15C of the eighth exemplary structure or FIG. 16C of the ninth embodiment.

The plurality of metal vias 690X of the tenth embodiment is arranged in a two-dimensional array including a plurality of one-dimensional arrays in radial directions that intersect one another at a center point underneath the center region CR. The spacing between neighboring metal vias of the plurality of metal vias 690X is less under the center region CR than under the peripheral regions PR in each of the plurality of one-dimensional arrays. The sum of the center region CR and the peripheral regions PR is the same as the total contact area between the metal pad 690 and the C4 ball 699 (See FIGS. 15A and 16A).

Figure 18:
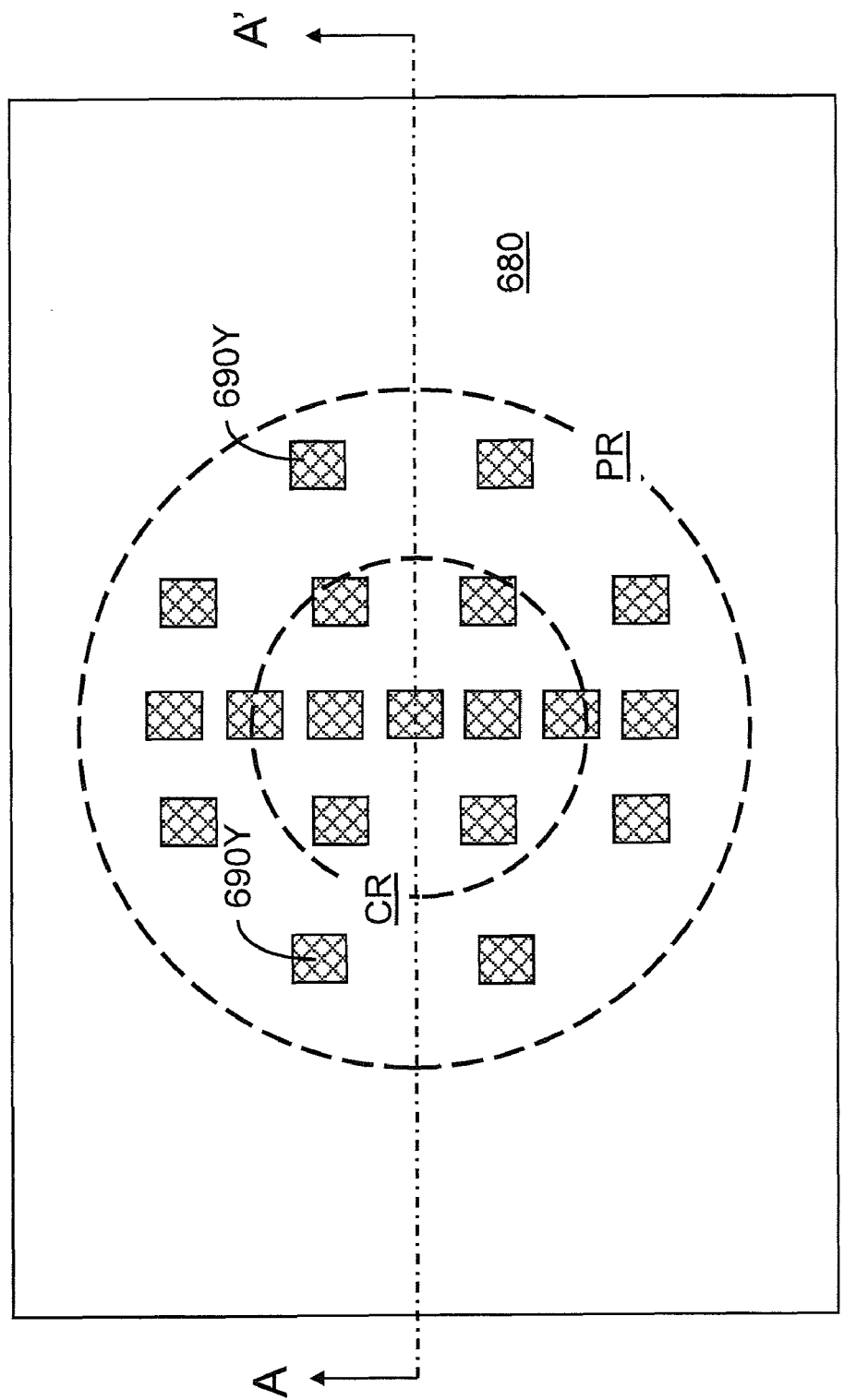
FIG. 18 is a horizontal cross-sectional view of a eleventh exemplary structure that employs a metal pad including an array of metal vias of a fourth type in a plane corresponding to FIG. 15C or FIG. 16C according to the present invention.

Referring to FIG. 18, a eleventh exemplary structure according to a eleventh embodiment of the present invention is shown. The eleventh exemplary structure is derived from the eighth or ninth exemplary structure by substituting a plurality of metal vias 690Y of a different type for the plurality metal vias 690V of the eighth embodiment or for the plurality of metal vias 690W of the ninth embodiment. FIG. 18 is a horizontal cross-sectional view of the eleventh exemplary structure in a plane corresponding to FIG. 15C of the eighth exemplary structure or FIG. 16C of the ninth embodiment.

The plurality of metal vias 690Y of the eleventh embodiment is arranged in a two-dimensional array in which the spacing between adjacent vias is modulated in two directions. Further, spacing in one direction may be dependent on the coordinate along another direction within the plane of the horizontal cross-section. The two-dimensional modulation of the spacing among the metal vias is effected such that the plurality of metal vias 690Y has a higher areal density of horizontal cross-sectional area underneath the center region CR of the metal pad 690 than underneath peripheral regions PR of the metal pad 690. The sum of the center region CR and the peripheral regions PR is the same as the total contact area between the metal pad 690 and the C4 ball 699 (See FIGS. 15A and 16A).

Figure 19:
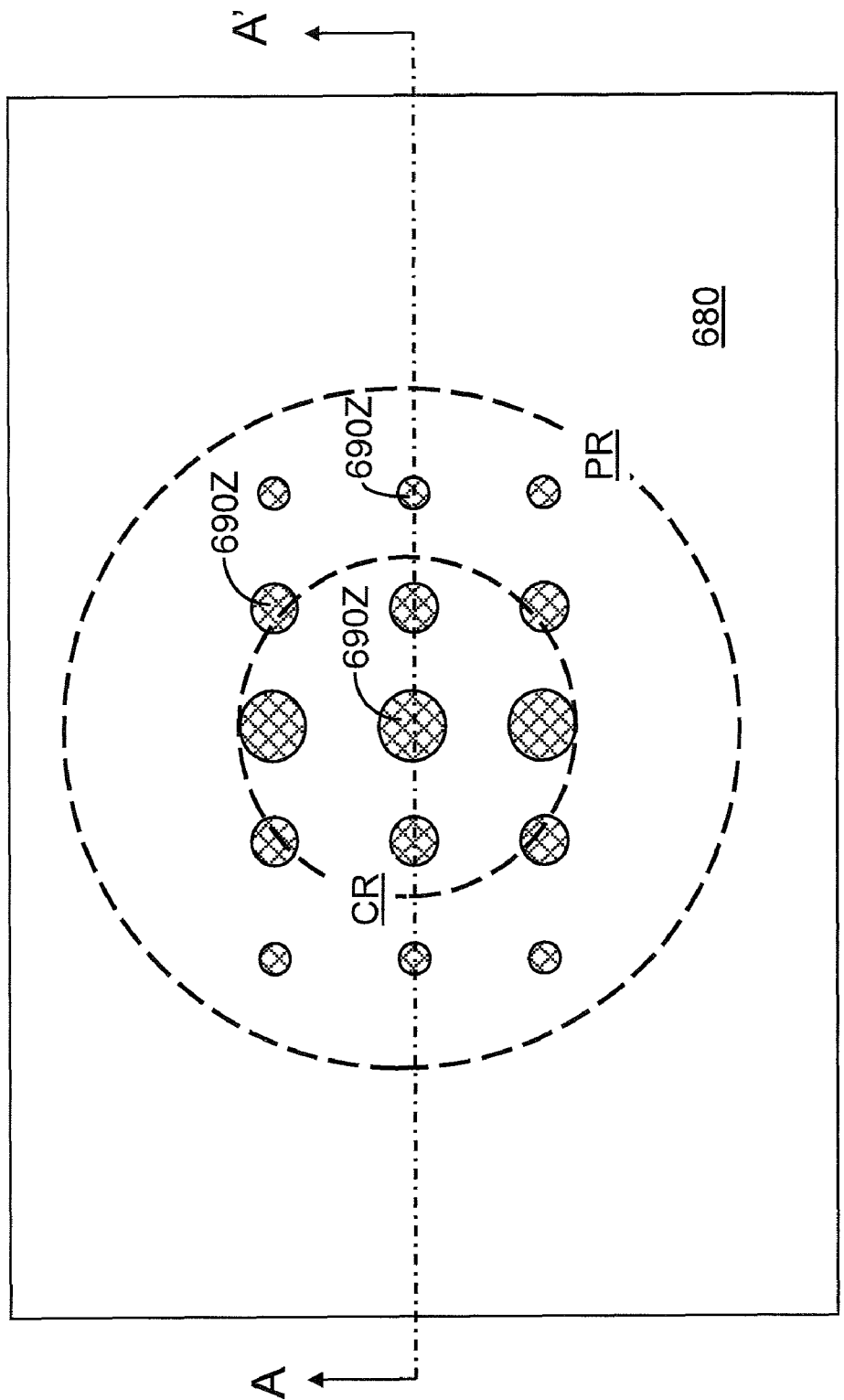
FIG. 19 is a horizontal cross-sectional view of a twelfth exemplary structure that employs a metal pad including an array of metal vias of a fifth type in a plane corresponding to FIG. 15C or FIG. 16C according to the present invention.

Referring to FIG. 19, a twelfth exemplary structure according to a twelfth embodiment of the present invention is shown. The twelfth exemplary structure is derived from the eighth or ninth exemplary structure by substituting a plurality of metal vias 690Z of a different type for the plurality metal vias 690V of the eighth embodiment or for the plurality of metal vias 690W of the ninth embodiment. FIG. 19 is a horizontal cross-sectional view of the twelfth exemplary structure in a plane corresponding to FIG. 15C of the eighth exemplary structure or FIG. 16C of the ninth embodiment.

The plurality of metal vias 690Z includes metal vias having different sizes. Specifically, metal vias located underneath the center region CR has a larger horizontal cross-sectional area than metal vias located underneath the peripheral regions PR. The size of the metal vias in the plurality of metal vias 690Z may vary along one direction (for example, along the direction of the plane A-A') or with radius from a center point two-dimensionally.

In all embodiment described above, the areal density of the conductive area of a plurality of metal vias (90V, 690W, 690X, 690Y, or 690Z) is greater underneath the center region CR of the contact area between the metal pad 690 and the C4 ball 699 than underneath the peripheral regions PR. Preferably, the resistance of the plurality of metal vias is greater than the resistance of the metal line structure 670A. The resistance of the plurality of metal vias is greater than the resistance of the metal line structure 670A typically by a factor from 1.5 to 40, and preferably from 3 to 10, although lesser and greater ratios are also contemplated herein.

The effect of providing a greater areal density of conductive area underneath the center region CR than underneath the peripheral regions PR is to direct a higher fraction of the current through the metal line structure 670A to the inside of the C4 ball 699 and to reduce the current along the surface of the C4 ball 699. This redistribution of electrical current has the effect of equalizing the current density through the C4 ball 699, thereby reducing the electromigration in the C4 ball 699 during the operation of a semiconductor chip.

Figure 20:
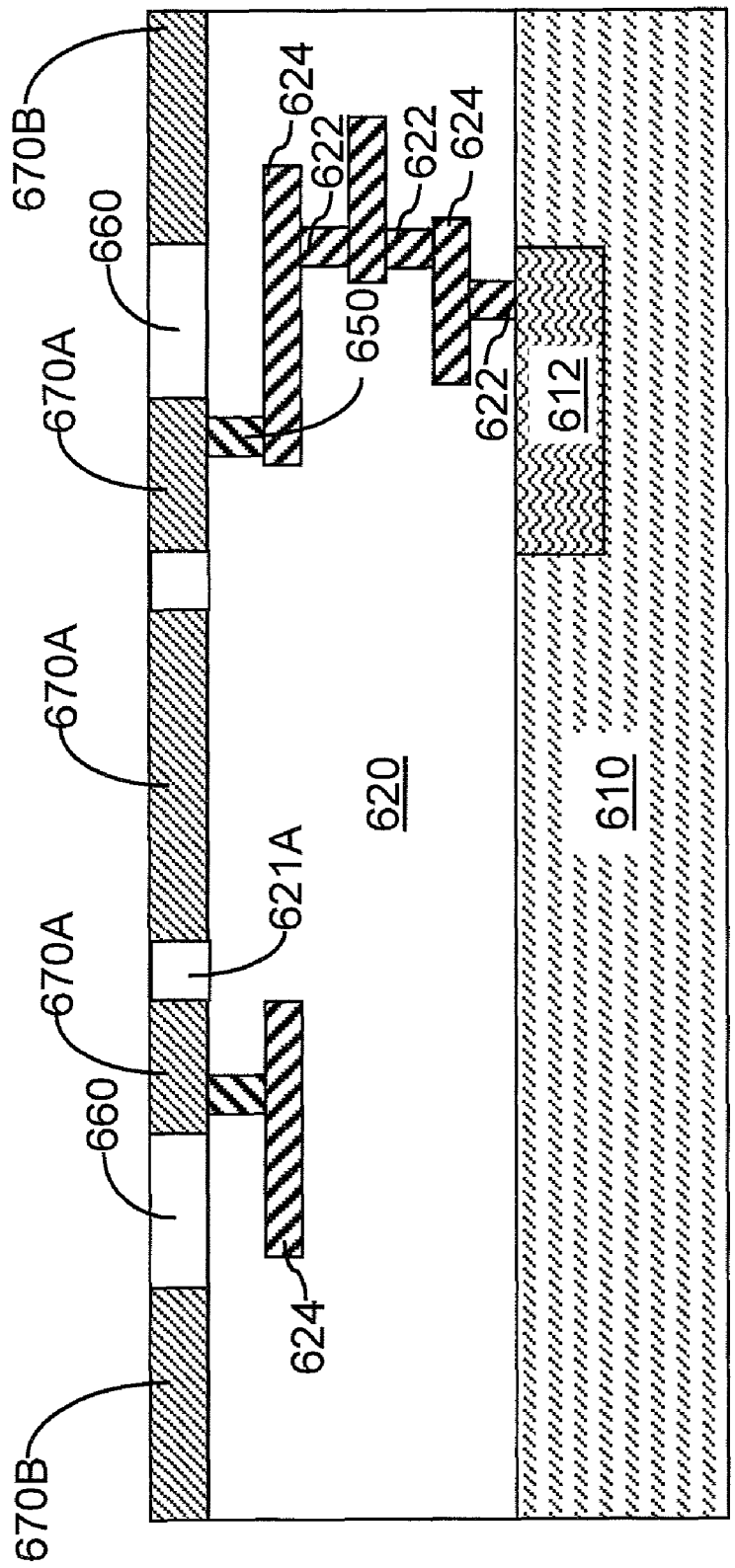
FIG. 20 is a vertical cross-sectional view of the eighth exemplary semiconductor structure after formation of a metal line structure.

Referring to FIG. 20, a method of forming the eighth exemplary structure of the present invention is shown. At least one semiconductor device 612 formed in a substrate 610 as well known in the art. The substrate 610 may be a semiconductor substrate as described above.

At least one dielectric layer 620 and a metal interconnect structure are formed by successive semiconductor processing steps of deposition and patterning. The metal interconnect structure may include interconnect level metal vias 622, interconnect level metal lines 624, and topmost interconnect vias 50. The topmost interconnect vias are formed by forming a via hole into the topmost surface of the at least one dielectric layer 620 and depositing a metal, for example, by electroplating, physical vapor deposition (PVD), chemical vapor deposition (CVD), electroless plating, or a combination thereof. A planarization process is performed to remove the metal above the topmost surface of the at least one dielectric layer 620. The remaining portion of the metal constitutes the topmost interconnect vias 50, which have top surfaces that are coplanar with the topmost surface of the at least one dielectric layer 620.

A line level dielectric layer 660 is deposited on top of the topmost interconnect vias 50 and the at least one dielectric layer 620. Recessed areas are formed in the line level dielectric layer 660 by lithographic patterning and filled with a conductive metal. The conductive metal is planarized to form the metal line structure 670A. Optionally, the upper level metal wiring lines 670B may be formed at the same time.

Figure 21:
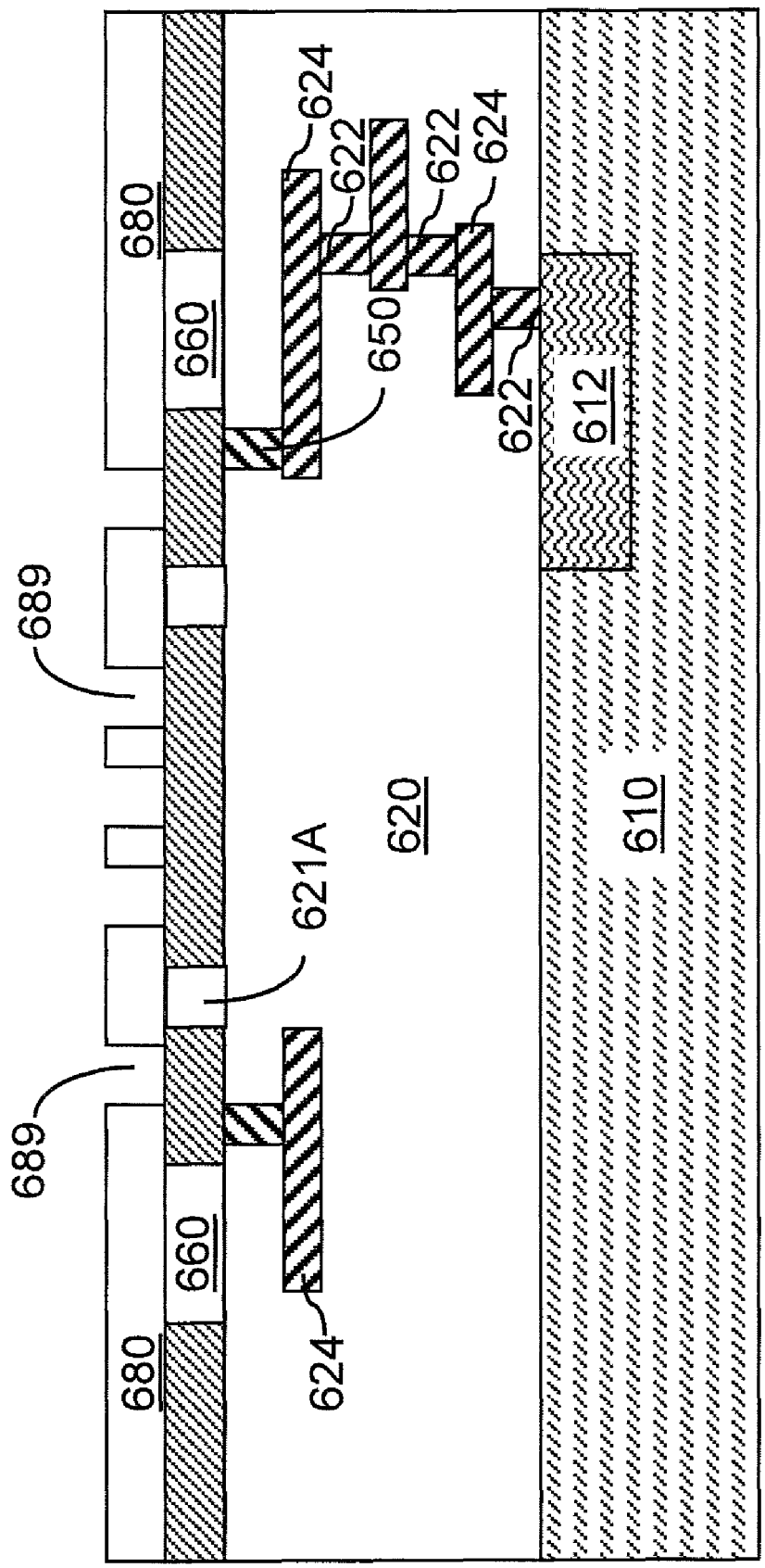
FIG. 21 is a vertical cross-sectional view of the eighth exemplary semiconductor structure after formation of a via level dielectric layer and an array of via holes therein.

Referring to FIG. 21, the passivation dielectric layer 680 is deposited and patterned to form a plurality of openings therein over the metal line structure 670A.

Figure 22:
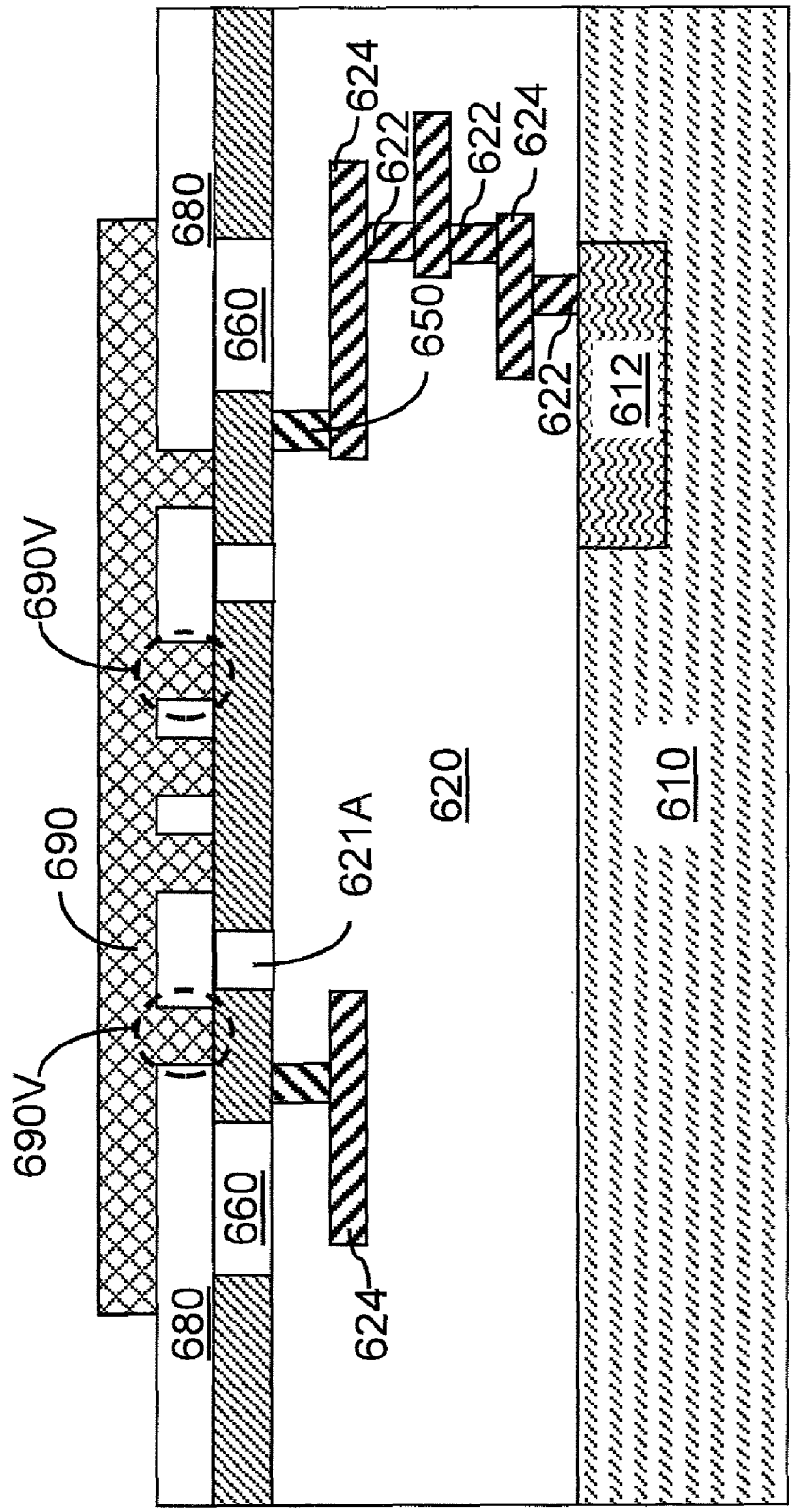
FIG. 22 is a vertical cross-sectional view of the eighth exemplary semiconductor structure after formation of a metal pad.

Referring to FIG. 22, the metal pad 690 is formed by depositing a metal layer such as an aluminum layer and lithographically patterning the metal layer. The area of the metal pad 690 includes the entirety of the area of the opening in the passivation dielectric layer 680. The portions of the metal pad that extends below the level of the top surface of the passivation dielectric layer constitute the plurality of metal vias 690V. The plurality of metal vias 690V and the upper planar portion, which is the complement of the plurality of metal vias 690V within the metal pad 690, are formed simultaneously.

Figure 23:
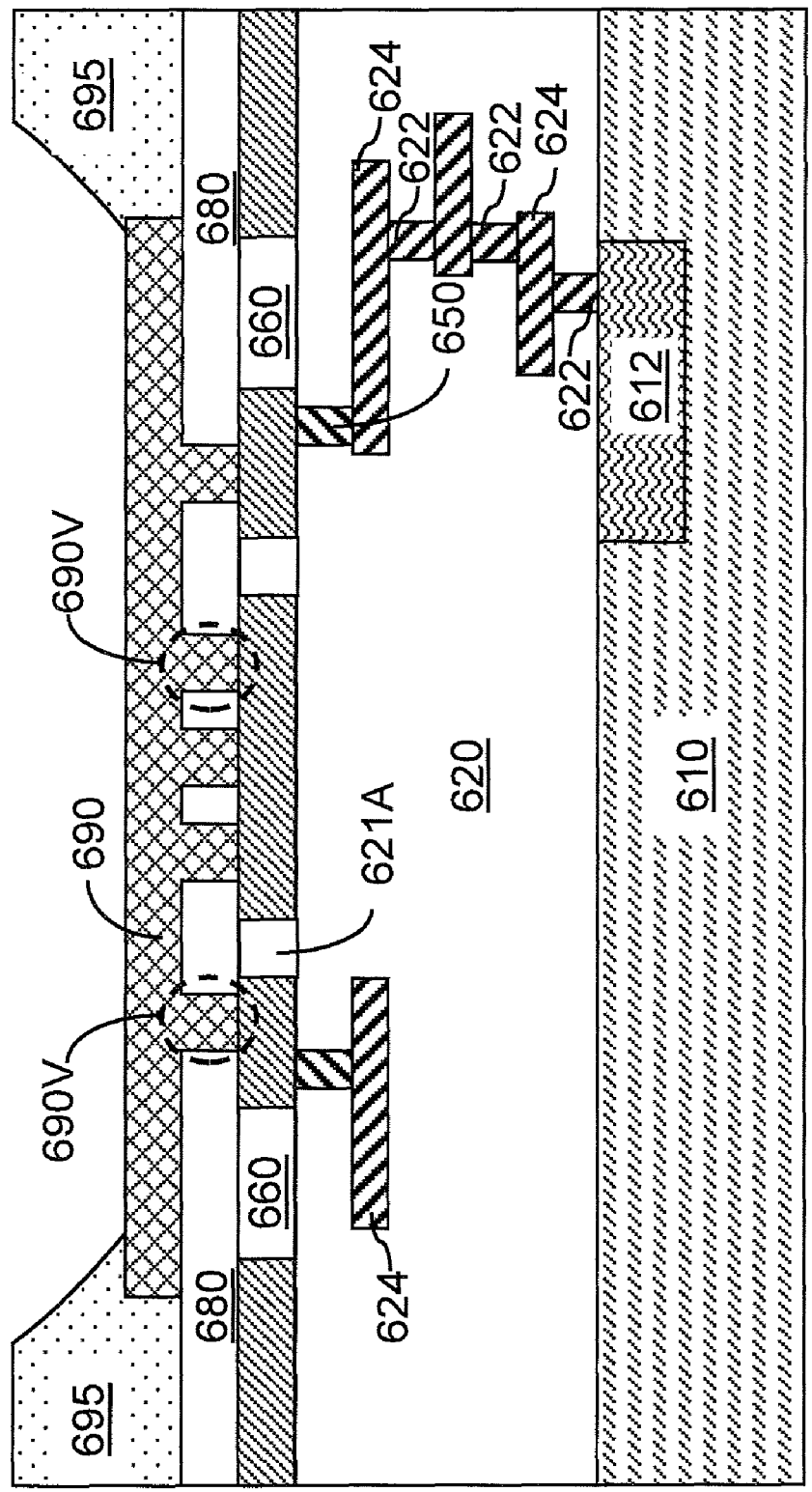
FIG. 23 is a vertical cross-sectional view of the eighth exemplary semiconductor structure after formation of a dielectric masking layer.

Referring to FIG. 23, the dielectric masking layer 695 is deposited over the metal pad 690 and the passivation dielectric layer 680. An opening in the dielectric masking layer 695 is formed within the area of the metal pad 690. Subsequently, a C4 ball 699 is placed on the exposed surfaces of the metal pad 690 to form the structure shown in FIGS. 15A-15D.

While the eighth exemplary structure is employed to illustrate the methods of manufacturing the eighth exemplary structure according to the present invention, the same method may be employed to form structures according to all other embodiments of the present invention as well.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising:
a metal pad disposed over a metal interconnect structure;
an upper level metal line structure abutting said metal pad;
a lower level metal line structure located beneath said upper level metal line structure; and
a set of metal vias, wherein said set of metal vias has a higher areal density of horizontal cross-sectional area beneath a center region of said metal pad than underneath peripheral regions of said metal pad.

2. The structure of claim 1, wherein each metal via in said set of metal vias vertically abuts said upper level metal line structure and said lower level metal line structure, wherein said metal pad comprises aluminum and each of said upper level metal line structure, said set of metal vias, and said lower level metal line structure comprises copper, and wherein said metal pad includes an upper planar portion and at least one via portion extending downward and abutting said upper level metal line structure.

3. The structure of claim 1, wherein said set of metal vias includes metal vias of substantially the same size.

4. The structure of claim 3, wherein at least some of said metal vias of substantially the same size are arranged in a one-dimensional array in which spacing between neighboring metal vias is less beneath said center region than beneath said peripheral regions.

5. The structure of claim 3, wherein said metal vias of substantially the same size are arranged in a plurality of one-dimensional arrays having a same orientation, wherein spacing between neighboring metal vias is less in a middle portion than in end portions in each of said plurality of one-dimensional arrays.

6. The structure of claim 3, wherein each metal via in said set of metal vias has a cross-sectional area of a circle or a rectangle.

7. The structure of claim 3, wherein each metal via in said set of metal vias has an elongated horizontal cross-sectional area, and wherein a horizontal width monotonically decreases with distance from a center point in each of said set of metal vias.

8. The structure of claim 7, wherein said horizontal width decreases in steps with distance from said center point along an elongated direction.

9. The structure of claim 7, wherein said set of metal vias is arranged in a one-dimensional array along a direction of said horizontal width.

10. The structure of claim 3, wherein said set of metal vias is arranged in a two-dimensional array in which a first spacing between neighboring metal vias is less under said center region than under said peripheral regions along a first direction.

* * * * *